United States Patent
Wood et al.

(10) Patent No.: US 7,235,431 B2
(45) Date of Patent: Jun. 26, 2007

(54) METHODS FOR PACKAGING A PLURALITY OF SEMICONDUCTOR DICE USING A FLOWABLE DIELECTRIC MATERIAL

(75) Inventors: Alan G. Wood, Boise, ID (US); Warren M. Farnworth, Nampa, ID (US); Charles M. Watkins, Eagle, ID (US); Peter A. Benson, Guilderland, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/934,109

(22) Filed: Sep. 2, 2004

(65) Prior Publication Data

US 2006/0046347 A1 Mar. 2, 2006

(51) Int. Cl.
*H01L 21/50* (2006.01)
*H01L 23/043* (2006.01)
(52) U.S. Cl. .................... 438/125; 257/709
(58) Field of Classification Search ........ 257/709–711, 257/787–795; 438/110–113, 124–127
See application file for complete search history.

(56) References Cited

U.S. PATENT DOCUMENTS

| | | | |
|---|---|---|---|
| 4,575,330 A | 3/1986 | Hull | |
| 4,929,402 A | 5/1990 | Hull | |
| 4,996,010 A | 2/1991 | Modrek | |
| 4,999,143 A | 3/1991 | Hull et al. | |
| 5,015,424 A | 5/1991 | Smalley | |
| 5,058,988 A | 10/1991 | Spence | |
| 5,059,021 A | 10/1991 | Spence et al. | |
| 5,059,359 A | 10/1991 | Hull et al. | |
| 5,076,974 A | 12/1991 | Modrek et al. | |
| 5,096,530 A | 3/1992 | Cohen | |
| 5,104,592 A | 4/1992 | Hull et al. | |
| 5,123,734 A | 6/1992 | Spence et al. | |
| 5,130,064 A | 7/1992 | Smalley et al. | |
| 5,133,987 A | 7/1992 | Spence et al. | |

(Continued)

FOREIGN PATENT DOCUMENTS

WO    WO 88/06494    9/1988

OTHER PUBLICATIONS

Stereolithography Resin is Optically Clear, www.manufacturingtalk.com/news/dsm/dsm103.html, Aug. 3, 2001, pp. 1-2.

(Continued)

*Primary Examiner*—Calvin Lee
(74) *Attorney, Agent, or Firm*—TraskBritt

(57) ABSTRACT

A method of packaging at least a portion of a semiconductor die or dice is disclosed. Uncured material may be disposed proximate at least the periphery of at least one semiconductor die and at least partially cured substantially as a whole. Methods of forming conductive elements such as traces, vias, and bond pads are also disclosed. More specifically, forming at least one organometallic layer to a substrate surface and selectively heating at least a portion thereof is disclosed. Also, forming a layer of conductive photopolymer over at least a portion of a surface of a substrate and removing at least a portion thereof is disclosed. A microlens having a plurality of mutually adhered layers of cured, optically transmissive material, methods of forming same, and systems so equipped are disclosed.

16 Claims, 11 Drawing Sheets

U.S. PATENT DOCUMENTS

| | | |
|---|---|---|
| 5,141,680 A | 8/1992 | Almquist et al. |
| 5,143,663 A | 9/1992 | Layden et al. |
| 5,164,128 A | 11/1992 | Modrek et al. |
| 5,174,931 A | 12/1992 | Almquist et al. |
| 5,174,943 A | 12/1992 | Hull |
| 5,182,055 A | 1/1993 | Allison et al. |
| 5,182,056 A | 1/1993 | Spence et al. |
| 5,182,715 A | 1/1993 | Vorgitch et al. |
| 5,184,307 A | 2/1993 | Hull et al. |
| 5,192,469 A | 3/1993 | Smalley et al. |
| 5,192,559 A | 3/1993 | Hull et al. |
| 5,209,878 A | 5/1993 | Smalley et al. |
| 5,234,636 A | 8/1993 | Hull et al. |
| 5,236,637 A | 8/1993 | Hull |
| 5,238,639 A | 8/1993 | Vinson et al. |
| 5,248,456 A | 9/1993 | Evans, Jr. et al. |
| 5,256,340 A | 10/1993 | Allison et al. |
| 5,258,146 A | 11/1993 | Almquist et al. |
| 5,264,061 A | 11/1993 | Juskey et al. |
| 5,267,013 A | 11/1993 | Spence |
| 5,273,691 A | 12/1993 | Hull et al. |
| 5,321,622 A | 6/1994 | Snead et al. |
| 5,344,298 A | 9/1994 | Hull |
| 5,345,391 A | 9/1994 | Hull et al. |
| 5,358,673 A | 10/1994 | Heller et al. |
| 5,378,508 A | 1/1995 | Castro et al. |
| 5,447,822 A | 9/1995 | Hull et al. |
| 5,481,470 A | 1/1996 | Snead et al. |
| 5,495,328 A | 2/1996 | Spence et al. |
| 5,501,824 A | 3/1996 | Almquist et al. |
| 5,554,336 A | 9/1996 | Hull |
| 5,556,590 A | 9/1996 | Hull |
| 5,569,349 A | 10/1996 | Almquist et al. |
| 5,569,431 A | 10/1996 | Hull |
| 5,571,471 A | 11/1996 | Hull |
| 5,573,722 A | 11/1996 | Hull |
| 5,609,812 A | 3/1997 | Childers et al. |
| 5,609,813 A | 3/1997 | Allison et al. |
| 5,610,824 A | 3/1997 | Vinson et al. |
| 5,630,981 A | 5/1997 | Hull |
| 5,637,169 A | 6/1997 | Hull et al. |
| 5,651,934 A | 7/1997 | Almquist et al. |
| 5,667,820 A | 9/1997 | Heller et al. |
| 5,672,312 A | 9/1997 | Almquist et al. |
| 5,676,904 A | 10/1997 | Almquist et al. |
| 5,688,464 A | 11/1997 | Jacobs et al. |
| 5,693,144 A | 12/1997 | Jacobs et al. |
| 5,695,707 A | 12/1997 | Almquist et al. |
| 5,711,911 A | 1/1998 | Hull |
| 5,779,967 A | 7/1998 | Hull |
| 5,814,265 A | 9/1998 | Hull |
| 5,854,748 A | 12/1998 | Snead et al. |
| 5,855,718 A | 1/1999 | Nguyen et al. |
| 5,855,836 A | 1/1999 | Leyden et al. |
| 5,885,511 A | 3/1999 | Heller et al. |
| 5,897,825 A | 4/1999 | Fruth et al. |
| 5,902,537 A | 5/1999 | Almquist et al. |
| 5,902,538 A | 5/1999 | Kruger et al. |
| 5,904,889 A | 5/1999 | Serbin et al. |
| 5,933,190 A | 8/1999 | Dierickx et al. |
| 5,943,235 A | 8/1999 | Earl et al. |
| 5,945,058 A | 8/1999 | Manners et al. |
| 5,969,424 A | 10/1999 | Matsuki et al. |
| 8,251,488 | 6/2001 | Miller et al. |
| 6,259,962 B1 | 7/2001 | Gothait |
| 6,266,874 B1 * | 7/2001 | DiStefano et al. ............ 29/846 |
| 6,297,138 B1 | 10/2001 | Rimai et al. |
| 6,307,243 B1 | 10/2001 | Rhodes |
| 6,326,698 B1 | 12/2001 | Akram |
| 6,417,022 B1 | 7/2002 | Hsiao |
| 6,468,891 B2 | 10/2002 | Williams |
| 6,500,746 B2 | 12/2002 | Williams |
| 6,521,844 B1 * | 2/2003 | Fuerniss et al. ............ 174/258 |
| 6,529,027 B1 | 3/2003 | Akram et al. |
| 6,537,482 B1 | 3/2003 | Farnworth |
| 6,549,821 B1 | 4/2003 | Farnworth et al. |
| 6,569,373 B2 | 5/2003 | Napadensky |
| 6,632,732 B2 | 10/2003 | Williams |
| 6,644,763 B1 | 11/2003 | Gothait |
| 6,658,314 B1 | 12/2003 | Gothait |
| 6,764,933 B2 | 7/2004 | Williams |
| 6,764,935 B2 | 7/2004 | Williams |
| 6,767,815 B2 | 7/2004 | Williams |
| 6,780,744 B2 | 8/2004 | Williams |
| 6,911,173 B2 | 6/2005 | Farnworth |
| 2001/0036718 A1 | 11/2001 | Williams |
| 2002/0123213 A1 | 9/2002 | Williams |
| 2002/0171177 A1 | 11/2002 | Kritchman et al. |
| 2002/0176793 A1 | 11/2002 | Moussa et al. |
| 2003/0045047 A1 | 3/2003 | Williams |
| 2003/0151167 A1 | 8/2003 | Kritchman et al. |
| 2003/0232461 A1 | 12/2003 | Bolken et al. |
| 2004/0018709 A1 | 1/2004 | Williams |

OTHER PUBLICATIONS

OCAMPO, Incorporation of Electrical Components in Rapid Prototyped Products, Marquette University, Biomedical Engineering Department, Milwaukee, Wisconsin. pp. 1-8.

US 5,778,409, 07/1998, Almquist et al. (withdrawn)

* cited by examiner

1

METHODS FOR PACKAGING A PLURALITY OF SEMICONDUCTOR DICE USING A FLOWABLE DIELECTRIC MATERIAL

BACKGROUND OF THE INVENTION

1. Field of the Invention

The present invention relates to semiconductor devices and components. Particularly, the present invention relates to at least partially packaging a semiconductor die or dice. The present invention also relates to forming conductive elements such as traces, vias, and bond pads. In addition, the present invention relates to a microlens for directing light toward a photosensor, methods of forming same, and systems so equipped.

2. Background of Related Art

The invention pertains to a method for sealing and protecting at least the periphery of one or more semiconductor dice. When a semiconductor die is conductively attached to a carrier substrate, conventionally encapsulating the assembly is very desirable to enhance the mechanical bond between the die and the substrate and to mutually laterally electrically isolate adjacent electrical connections therebetween. More specifically, one common configuration for electrically connecting a semiconductor die is a so-called flip-chip package, wherein an array or pattern of external conductive elements, such as solder bumps or conductive or conductor-filled epoxy pillars, protrude from the active surface of the semiconductor die for use in mechanically and electrically connecting the semiconductor die to like-patterned ends of conductive traces of higher level packaging, such as a carrier substrate. Other semiconductor die configurations may include a die mounted to a lead frame (having a die mounting paddle configuration, or in a paddle-less leads-over-chip (LOC) configuration, or in a leads-under-chip (LUC) configuration) and, optionally, mounted to a carrier substrate in a chip-on-board (COB) or board-on-chip (BOC) arrangement, or in other packaging designs, as desired.

Conventional encapsulation typically involves transfer molding an encapsulant, usually a particulate silica filled thermoset, to substantially surround a semiconductor die electrically connected and mechanically affixed to a carrier substrate. Transfer molds typically comprise a bottom mold and an upper mold, wherein the mold halves may be mated to one another to form a plurality of predefined cavities, wherein usually one predefined cavity receives one of a plurality of semiconductor dice. Each semiconductor die may be placed within the cavity and encapsulant may be forced into each of the plurality of cavities to form an encapsulation structure that encapsulates the semiconductor chip and portions of the lead frame or carrier substrate.

In operation, a heated, silica-filled resin mold compound, usually a thermoset, is heated to a molten state, forced under pressure through runners into and through the mold cavities, wherein semiconductor die assemblies comprising semiconductor dice with attached lead frames or substrates are disposed (usually in strips or other groups, so that a group of six semiconductor dice, for example, would be placed in and across six cavities formed by the molds). After molding, the encapsulated semiconductor die assemblies may be ejected from the cavities by ejector pins, after which they may be post-cured at an elevated temperature to complete cross-linking of the resin mold compound, followed by other operations as known in the art. It will be appreciated that other transfer molding apparatus configurations, as well as variations in the details of the described method, are known in the art.

Undesirably, encapsulant flow during conventional transfer molding within mold cavities is demonstrably nonuniform. Therefore, encapsulant filler particles may become lodged between lead ends and the underlying die surfaces because the flow characteristics of the viscous encapsulant flow may cause particles to be forcefully driven between the lead ends and the additional surfaces of the semiconductor die and wedged or jammed in place in low-clearance areas. As the encapsulant flow front advances and the mold operation is completed by packing the cavities, pressure in substantially all portions of the mold cavities may be substantially hydrostatic. With LOC arrangements, where lead ends extending over the active surface of a die are bonded thereto by adhesive-coated tape segments or an adhesive material patterned on the active surface, the relative inflexibility of the tightly-constrained (adhered) lead ends maintains the point stresses of any particles trapped under the lead ends. These residual stresses are carried forward in the fabrication process to post-cure and beyond. When mechanical, thermal or electrical stresses attendant to post-encapsulation processing are added to the residual stresses associated with the lodged filler particles, cracking or perforation of the die coat may occur. It has been observed that filler particle-induced damage may occur more frequently in close proximity to the adhesive, where lead flexibility is relatively low. In addition to damage by filler particles, transfer molding also results in the problem of bond wire sweep, wherein bond wires may be damaged, broken, or loosened from their connections to bond pads or lead ends, or swept into shorting contact with an adjacent bond wire under the impetus of the flow front of molten resin encapsulant as it flows through a mold cavity. Also, due to increased pressures exerted on the encapsulant, a small amount of the encapsulation material often may flash between the mold halves, which may interfere with handling or require removal.

In addition to end-product deficiencies as noted above due to the phenomena of particulate die coat penetration, flash formation, and bond wire sweep, the capital-intensive nature of the transfer molding apparatus, including the requirement for different, relatively expensive molds for each die and lead frame or other substrate arrangement, as well as the high cost of the encapsulant resin and waste of same that is not used in the mold cavities, renders the transfer molding process an extremely expensive one. Mold damage and refurbishment is an additional, ongoing cost. Further, the elevated temperatures used in the molding process, as well as in the post cure of the resin encapsulant, are detrimental to the circuitry of the die as well as to the electrical connections to the lead ends.

Accordingly, the prior art has developed nonmolding encapsulation techniques for surrounding and at least partially sealing semiconductor dice. For instance, U.S. Pat. No. 6,549,821 to Farnworth et al., assigned to the assignee of the present invention and the disclosure of which is incorporated herein in its entirety by reference thereto, discloses a method and apparatus for applying packaging material to workpieces, particularly electronic components including semiconductor dice.

In addition, U.S. Pat. No. 6,537,482 to Farnworth, assigned to the assignee of the present invention and the disclosure of which is incorporated herein in its entirety by reference thereto, discloses a method for underfilling and encapsulating flip-chip configured semiconductor devices mounted on a carrier substrate using stereolithography to form at least semisolid dam structures of photopolymeric material to entrap unpolymerized resin between the devices and substrate.

However, in either of the above-mentioned conventional stereolithography approaches to encapsulation of semiconductor dice, the need for forming a multitude of relatively thin layers stereolithographically may be time consuming and may also depend on precise placement of the semiconductor dice, or, alternatively, a vision system for detecting the position thereof. Thus, there remains a need for improved apparatus and methods for at least partially encapsulating semiconductor dice without performing transfer molding.

Turning to another facet of conventional electronic fabrication techniques, conventional conductive traces may be formed by CVD processes, cold-metal deposition processes, plating processes, or other conventional additive techniques in combination with resist and etching processes, by way of solder paste deposited through a stencil, or by way of selective removal of copper from a copper dielectric laminate, as by masking and etching or other conventional subtractive techniques.

In relation to semiconductor dice, tape automated bonding (TAB) is sometimes used to form an electrical connection between the unpackaged die and external circuitry on a circuit board or other substrate. A TAB tape includes a flexible film, such as polyimide, having circuit traces formed thereon. The circuit traces may include bumps that are adapted for electrical connection to the bond pads on a die. The bumps and the circuit traces on the TAB tape provide an electrical path from the bond pads of the semiconductor die to external circuitry.

Also, circuit boards are often assembled with semiconductor devices to electrically connect different semiconductor devices to one another or to other components of an electronic device. Typically, circuit boards have one or more layers of metal circuitry carried by the insulating, or dielectric, substrates thereof. When circuit boards have conductive circuits extending across more than one plane thereof, the circuits may be electrically connected by way of through holes or blind holes that are metal plated or filled, which are known as conductive "vias."

U.S. Pat. Nos. 6,500,746 and 6,632,732 to Williams, each assigned to the assignee of the present invention and the disclosure of each of which is incorporated herein in its entirety, each discloses stereolithographically fabricated conductive elements that may be formed onto circuit boards or chip scale packages. The patents also disclose that conductive traces, bond pads, and conductive vias may be formed stereolithographically. Further, U.S. Pat. No. 6,251,488 to Miller et al. discloses a precision spray process wherein metal particles are propelled toward a surface and heated while in flight toward the surface by a laser beam.

However, while the prior art methods may function as intended for forming conductive elements, there is a need for improved apparatus and methods for forming conductive elements, such as traces, bond pads, and conductive vias that are associated with electronic devices, such as circuit boards, or upon other substrates.

Moving to a further aspect of the prior art, it is known in the art to use a microlens array in combination with an imager array, such as a CMOS imager array, wherein the microlens array comprises a convex microlens associated with each pixel or the CMOS imager. Each microlens is configured to refract incident radiation from the circuitry region of the pixel to the photosensor region of the CMOS imager, thereby increasing the amount of light reaching the photosensor and increasing the fill factor of the pixels. Other uses of microlens arrays may include intensifying illuminating light on the pixels of a nonluminescent display device, such as a liquid crystal display device to increase the brightness of the display, forming an image to be printed in a liquid crystal or light emitting diode printer and as a focusing structure for coupling a luminescent device or a receptive device to an optical fiber.

Conventionally, a microlens or microlens array may be formed by depositing a microlens material layer by spin coating onto a surface of a semiconductor structure, in general alignment with a photosensor region thereof. The microlens areas may be patterned by a conventional photolithographic method, such as, for instance, a resist and etch process, and then may be subjected to increased temperature by a reflow process, for instance, at a temperature of about 160° Celsius. More specifically, the temperature may exceed the glass transition temperature of the microlens material, so that the upper surface area thereof forms an arcuate or domed surface, according to the surface tension or cohesive forces in the microlens material. A microlens may be formed of a transparent material exhibiting a suitable refractive index. For instance, a microlens may comprise an optical thermoplastic, such as polymethylmethacrylate, polycarbonate, polyolefin, cellulose acetate butyrate, polystyrene, or polyimide; a thermoset resin such as an epoxy resin; a photosensitive gelatin; or a radiation curable resin, such as acrylate, methacrylate, urethane acrylate, epoxy acrylate, or polyester acrylate.

U.S. Pat. No. 6,307,243 to Rhodes, assigned to the assignee of the present invention and the disclosure of which is incorporated herein in its entirety by reference thereto, discloses a microlens array for use in a solid-state imager having an improved fill factor. More specifically, an insulation layer is formed of transparent insulating material, such as silicon oxide, silicon nitride, or silicon oxynitride, above each microlens in order to capture more light at the pixel edges and transmit such light to the photosensor, thereby improving the fill factor of the microlens array.

However, there is a need for improved apparatus and methods for forming one or more microlens structures. Particularly, there is a need for improved apparatus and methods for forming one or more microlens structures that are associated with image arrays, such as CMOS imagers.

BRIEF SUMMARY OF THE INVENTION

In one aspect of the present invention, a plurality of semiconductor dice may be at least partially encapsulated or packaged by application of a flowable dielectric material thereabout and subsequent bulk or en masse hardening or curing thereof. More particularly, a plurality of semiconductor dice may be disposed upon a carrier and a package material, such as, for instance, a photopolymer, may be disposed about the periphery of the semiconductor dice and at least partially cured substantially en masse. The uncured material may be prevented from at least partially curing proximate to the contact or bond pads of the at least one semiconductor die. Alternatively, at least partially cured material may be removed to expose the contact pads of the at least one semiconductor die. Further, conductive traces may be formed on the package material, applied as TAB, or otherwise formed to facilitate electrically connecting the at least one semiconductor die to other, higher-level electrical components. Of course, a plurality of semiconductor dice may each be affixed to a carrier, at least partially encapsulated, and subsequently diced or singulated through the cured dielectric material to form a plurality of respective, individually-packaged semiconductor dice.

In another aspect of the present invention, a method for forming a substrate that carries one or more conductive traces is disclosed. The conductive traces, bond pads, or vias of a substrate may be formed by depositing a layer of organometallic material, such as, for instance, Emulsitone palladium or platinum. The organometallic layer may be deposited in an uncured form, such as a liquid, with the metallic material or precursors dispersed therein. The organometallic layer may be dried, and then at least portions of the organometallic layer selectively heated, as by a laser beam, to consolidate the metallic particles and at least partially remove the organic compounds remaining in the organometallic layer. The substrate may, subsequent to selective heating, be rinsed with a solvent of suitable compatibility with an underlying substrate (e.g., isopropyl alcohol) to remove the uncured organometallic layer or organic material remaining in the exposed portion of the organometallic layer.

Further, in another aspect of the present invention, a conductive element may be formed onto a substrate by depositing an uncured material onto a surface of a substrate, selectively at least partially curing the uncured material over at least a portion of the surface thereof, and removing a portion of the at least partially cured material. Particularly, a conductive photopolymer may be deposited over at least a portion of a substrate surface, at least partially cured, and then selectively removed to form conductive elements.

Substrates upon or within which conductive elements are formed according to the present invention may be relatively rigid, such as printed circuit board substrates; relatively flexible, such as those used in TAB; or intermediate in flexibility, without limitation. Accordingly, substrates, including conductive elements of the present invention, may comprise a polyimide, FR4, or ceramic material.

The present invention also contemplates a method of fabrication of a microlens for use in an imaging device. Specifically, a flowable, uncured optically transmissive material may be disposed onto a surface of a substrate and at least a portion thereof may be selectively at least partially cured. Further, the uncured optically transmissive material may be removed from the surface of the substrate. The uncured optically transmissive material may comprise a material with suitable optical characteristics, such as at least one of a photopolymer and a thermoplastic.

The microlens may comprise one or more superimposed, mutually adhered layers. Also, an exterior surface of the microlens may exhibit stair-stepping. Alternatively, an exterior surface of the microlens may be formed to be relatively smooth by way of at least one of heating the microlens to a temperature exceeding a glass transition temperature thereof, micromachining with a laser beam, and exposing the microlens to a solvent.

The present invention also contemplates a microlens for directing radiation toward a sensor of an imaging device comprising a plurality of mutually adhered layers of cured optically transmissive material.

Other features and advantages of the present invention will become apparent to those of skill in the art through consideration of the ensuing description, the accompanying drawings, and the appended claims.

DETAILED DESCRIPTION OF THE INVENTION

In one aspect of the present invention, one or more semiconductor dice may be at least partially encapsulated by application of a curable material thereabout and subsequent bulk or en masse hardening or curing thereof. More particularly, one or more semiconductor dice may be disposed upon a carrier and a package material (also termed an encapsulant), such as, for instance, a photopolymer, may be disposed about the periphery of the semiconductor dice and cured substantially in bulk or en masse. Subsequent to hardening or curing, the package material may be patterned, if necessary, to expose contact or bond pads of the semiconductor dice. Conductive traces and surface mount components may be disposed or formed as desired during or after the hardening of the package material. Such a configuration may eliminate the need for expensive transfer molding equipment and may provide increased flexibility in manufacturing.

Figure 1A:
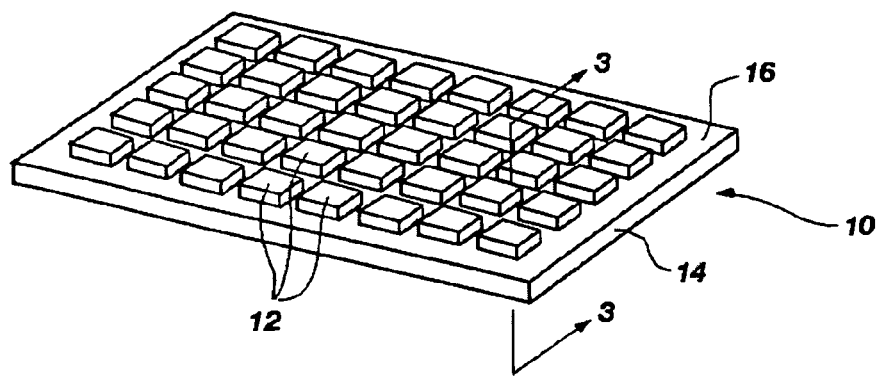
FIG. 1A is a perspective schematic representation of an array of individual, or singulated, semiconductor dice disposed on a carrier.

FIG. 1A shows, in a perspective view, array 10, which includes a plurality of semiconductor dice 12 disposed on a carrier 14 and arranged on the upper surface 16 thereof. Semiconductor dice 12 may comprise known good dice, which have been tested to indicate at least a selected level of functionality. However, the use of known good dice is not limiting of the present invention. Carrier 14 may comprise a solid substrate, such as a wafer or other bulk substrate blank, a tape or film, or a printed circuit board (PCB) substrate. Each of the plurality of semiconductor dice 12 may be adhesively affixed to carrier 14 in order to maintain the position of each of semiconductor dice 12 in relation to other semiconductor dice 12. For instance, semiconductor dice 12 may be placed onto the upper surface 16 of carrier 14 by way of precision pick and place machinery, as known in the art. Alternatively, or additionally, recesses (not shown) may be formed into the upper surface 16 of carrier 14 to facilitate placement, retention, or placement and retention of semiconductor dice 12.

In a further alternative, a wafer may be diced to form semiconductor dice 12, each of which may be affixed to a flexible film (not shown) and then the flexible film may be stretched to form gaps between semiconductor dice 12 and then encapsulated as described in more detail hereinbelow. Optionally, the flexible film may be affixed to the wafer prior to dicing, and dicing may extend through the wafer but not through the flexible film.

Figure 1B:
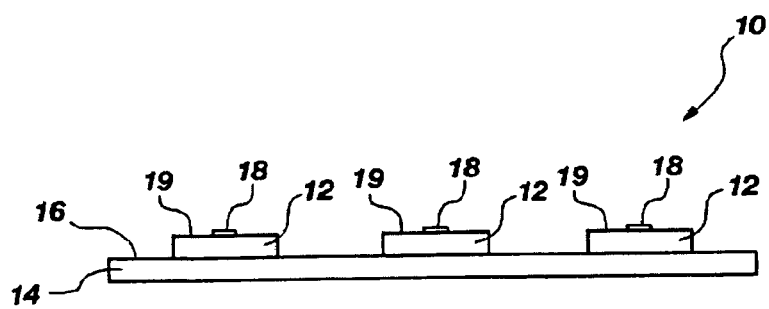
FIG. 1B is a partial side cross-sectional view of the array shown in FIG. 1A, the cross-section taken along line 3—3 and viewed generally from direction 1.
Figure 1C:
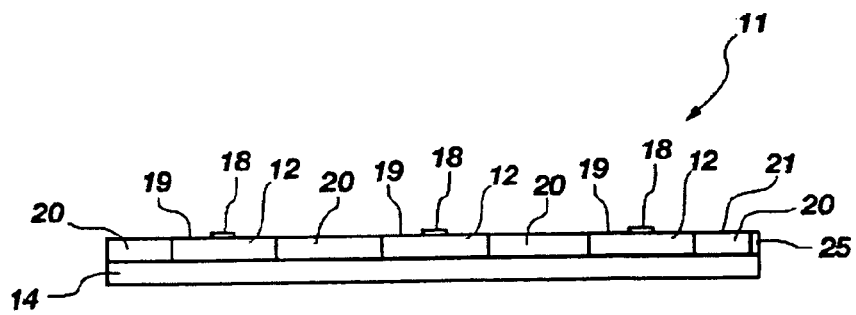
FIG. 1C is a partial side cross-sectional view of the array shown in FIG. 1B, wherein the semiconductor dice are partially encapsulated into an assembly and the encapsulating material is substantially coplanar with the active surfaces of the semiconductor dice.

As shown in FIG. 1B, which depicts a partial side cross-sectional view of the array 10 shown in FIG. 1A along reference line 3—3, each of semiconductor dice 12 may include, on the active surface 19 thereof, contact or bond pads 18 for electrical connection and communication to other, higher-level components. FIG. 1C depicts a partial side cross-sectional view of the array 10 shown in FIG. 1B, including package material 20 disposed about semiconductor dice 12. More particularly, package material 20 may comprise a photopolymer that is initially disposed about semiconductor dice 12 by way of immersing, dipping, spin-coating, printing (stencil or screen printing, or other printing deposition process as known in the art), or spraying. Thus, uncured package material 20 disposed about semiconductor dice 12 may exhibit an upper surface that is free, meaning substantially free to deform or be shaped according to the internal cohesive forces thereof. As may be appreciated, a retaining wall 25 that extends vertically along the outer periphery of carrier 14, at least to the upper surface 21 of package material 20, may be desirable to capture or retain uncured package material 20 disposed interstitially between semiconductor dice 12. Accordingly, the package material 20 may fill between and around the lateral peripheries of semiconductor dice 12 of array 10 as shown in FIG. 1C.

If package material 20 comprises a photo-curable polymer, or "photopolymer," curing or hardening may occur in response to exposure to light in the ultraviolet ("UV") wavelength range. For instance, package material 20 may comprise a photopolymer as known in the art, such as, for instance, commercially available photopolymers for use in stereolithography systems are available from Ciba Specialty Chemicals Inc. In addition, commercially available photopolymers for use in stereolithography systems are available from RPC, Ltd. of Marly, Switzerland, a wholly owned subsidiary of 3D Systems Corporation. As one may appreciate, package material 20 may be preferably dielectric, so as to electrically insulate the semiconductor die as well as any conductive traces that may communicate therewith.

Accordingly, package material 20 may initially be uncured, i.e., a liquid, which may be at least partially cured subsequent to disposing about the periphery of each of semiconductor dice 12. Package material 20 extending between semiconductor dice 12 may be hardened or cured substantially en masse or substantially as a whole in response to exposure to a UV light or heat. Put another way, curing of package material 20 may be effected substantially en masse or substantially as a whole subsequent to deposition thereof by broad-source UV light in a chamber, thermal cure in an oven, microwave cure, or a combination thereof. In this manner, relatively thick, or deep, sections of package material 20 may be formed in a minimal amount of time.

The formation of relatively thick sections or regions of hardened or cured package material 20 substantially en masse or substantially as a whole may be advantageous in reducing, if not eliminating repeated scanning, of layer by layer regions of uncured package material dispersed between and around semiconductor dice 12 by way of traversing a focused laser beam to at least partially cure the same as may be required by conventional stereolithographic methods of encapsulation.

It should be understood, however, that hardening or curing uncured package material, when described herein as occurring substantially as a whole, substantially en masse, or substantially in bulk, does not imply "instant" curing of the entire volume of uncured package material. Rather, the above-listed references refer to a condition, wherein the environmental condition that causes curing of the uncured package material applies to or influences a substantial portion or volume of the uncured package material at substantially the same time. Such a configuration may decrease the amount of time that is required to complete the desired curing. However, curing the uncured package material may be performed selectively, i.e., excluding portions of uncured package material, or may occur in sequential steps, e.g., curing by UV light to form an initial structure, followed by oven heating or microwave curing to cure additional uncured package material.

Thus, as shown in FIG. 1C, each of semiconductor dice 12 may be at least partially surrounded or encapsulated by package material 20 to form packaged assembly 11. Package material 20, in combination with carrier 14, may effect substantially complete semihermetic sealing of semiconductor dice 12 in relation to the areas surrounded therewith and may be formed thereabout in several ways, depending on the semiconductor dice 12 configurations and how semiconductor dice 12 are to be connected to higher-level packaging. In particular, upper surface 21 of package material 20 may be substantially coplanar with active surfaces 19 of semiconductor dice 12, as shown in FIG. 1C. Such a configuration may allow for ease in forming electrically conductive traces extending from contact or bond pads 18 and may facilitate bulk curing of package material 20, without additional apparatus and processes to prevent package material 20 from covering contact or bond pads 18 or to remove package material 20 therefrom, as explained in more detail hereinbelow.

Figure 1D:
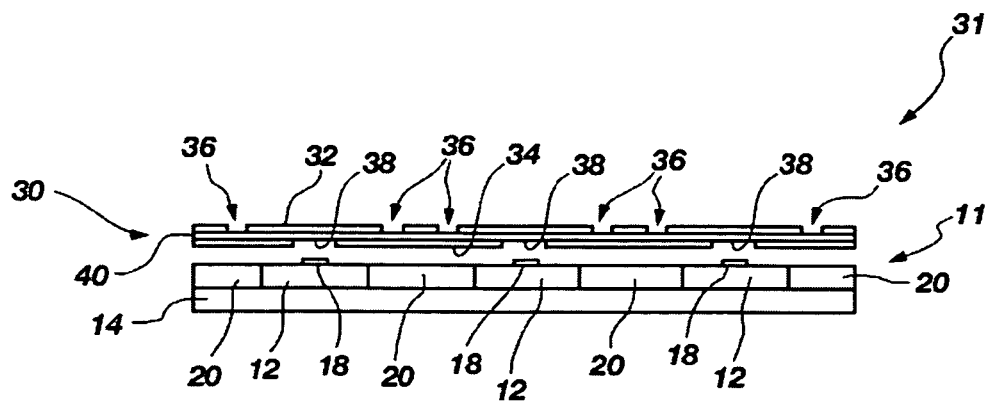
FIG. 1D is an exploded partial side cross-sectional view of the assembly shown in FIG. 1C, including a laminate structure for assembly therewith.

Regarding the formation of conductive traces, as shown in FIG. 1D, which depicts a partial side cross-sectional view of assembly 31, connection recesses 36 may be formed by applying laminate structure 30 to the upper surface of packaged assembly 11. Laminate structure 30 may comprise dielectric upper layer 32, dielectric lower layer 34, and conductive traces 40 disposed therebetween. Laminate structure 30 may preferably comprise a flex tape or TAB configuration, as known in the art, without limitation. Dielectric upper layer 32, which is optional, may include apertures formed therein to expose a portion of conductive traces 40 that comprise connection recesses 36. Likewise, dielectric lower layer 34 may include apertures formed therein to expose a portion of conductive traces 40 to form connection recesses 38, by which, conductive traces 40 may be electrically connected to contact or bond pads 18. Therefore, conductive traces 40 may extend from connection recesses 38 laterally outwardly to connection recesses 36. Accordingly, connection recesses 38 may be sized and configured to align and electrically connect to contact or bond pads 18 of semiconductor dice 12. As may be appreciated, laminate structure 30 may be configured for communicating electrical signals between outer lead bonds (OLBs), i.e., connection recesses 36 and inner lead bonds (ILBs), i.e., the portion of conductive trace 40 connected to contact or bond pads 18 at connection recesses 38. Dielectric lower layer 34 may include an adhesive (not shown) for affixing laminate structure 30 to packaged assembly 11. Further, such a configuration may inhibit moisture or contaminants from contacting contact or bond pads 18 of semiconductor dice 12 or the electrical connections thereto.

Alternatively, a protective layer (not shown), instead of laminate structure 30, may be disposed and adhesively affixed onto the active surfaces 19 of semiconductor dice 12 and the upper surface 21 of package material 20. The protective layer may comprise a dielectric having apertures formed therein configured for depositing conductive material, such as, for instance, solder paste. Solder paste may be deposited through a stencil mask (e.g., screen-printing or other printing technology as known in the art), or as otherwise known in the art and may be subsequently heated via a reflow oven or the like to form conductive traces 40.

Figure 1I:
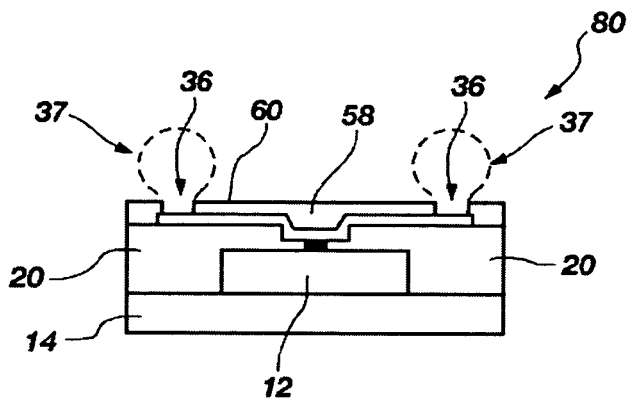
FIG. 1I is a partial cross-sectional view of a singulated die of the assembly shown in FIG. 1H.
Figure 1E:
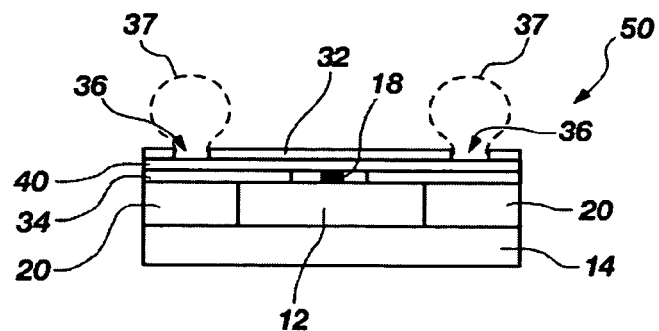
FIG. 1E is a side cross-sectional view of a singulated die of the assembly shown in FIG. 1D after application of the laminate structure.

Additionally, semiconductor dice 12 may be singulated to form packaged die 50 as shown in FIG. 1E. Solder balls 37, as shown in broken lines, may be disposed or formed on connection recesses 36, as desired, for connection with other devices or components. As may be appreciated by one of ordinary skill in the art, there are many alternative configurations for at least partially packaging one or more semiconductor dice according to the present invention. Also, there are many alternative configurations for exposing contact or bond pads covered by cured package material or preventing such coverage thereof and subsequent formation of conductive traces extending therefrom, according to the present invention.

Figure 1F:
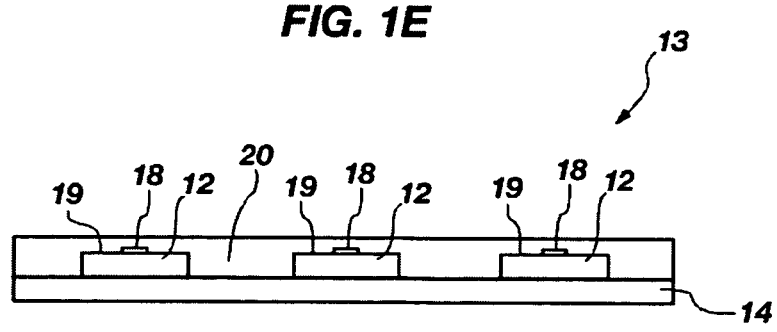
FIG. 1F is a partial side cross-sectional view of the array shown in FIG. 1B, wherein the semiconductor dice are partially encapsulated into an assembly and the encapsulating material covers at least a portion of the active surfaces of the semiconductor dice.

For instance, in one alternative, as shown in FIG. 1F, packaged assembly 13 may include package material 20 that extends over the active surfaces 19 of semiconductor dice 12. As described above, package material 20 may initially be uncured or flowable (i.e., a liquid) and may be at least partially cured or solidified substantially concurrently, substantially as a whole or en masse, subsequent to being disposed about the periphery of each of semiconductor dice 12. Accordingly, package material 20 may be cured in response to exposure to a UV light or exposure to heat, e.g., curing of package material 20 by broad-source UV light, thermal cure, microwave cure, or combinations thereof. Accordingly, package material 20 covering semiconductor dice 12 may be cured in minimal time.

Figure 1G:
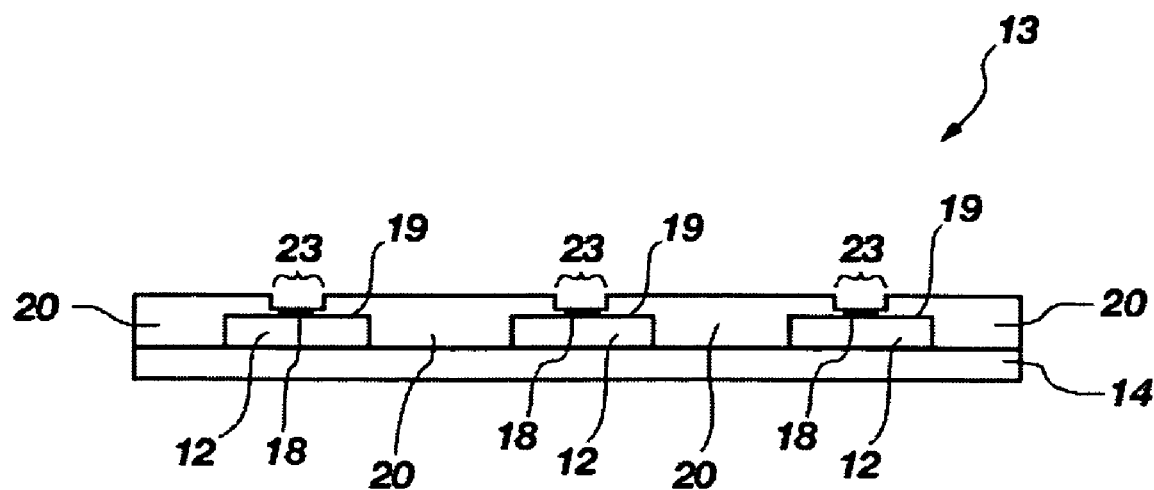
FIG. 1G is a side cross-sectional view of the assembly shown in FIG. 1F, after a photoresist, mask, and etch process is used to expose the contact pads of the semiconductor dice.

Further, since contact or bond pads 18 may be surrounded or covered by cured package material 20, a photoresist resist application followed by a mask and etch process may be performed to remove the hardened material 20 disposed thereabove. Accordingly, in order to pattern the package material 20, a photoresist resist layer (not shown) may be formed and patterned over the package material 20 surrounding or otherwise laterally adjacent to the contact or bond pads 18, to protect the package material thereunder while the exposed package material 20 superimposed above the contact or bond pads 18 may be removed by, for instance, an etching process. Subsequently, photoresist resist layer (not shown) may be removed (stripped), as known in the art, leaving the remaining patterned package material 20 with contact or bond pads 18 exposed through apertures 23 (FIG. 1G).

Figure 1H:
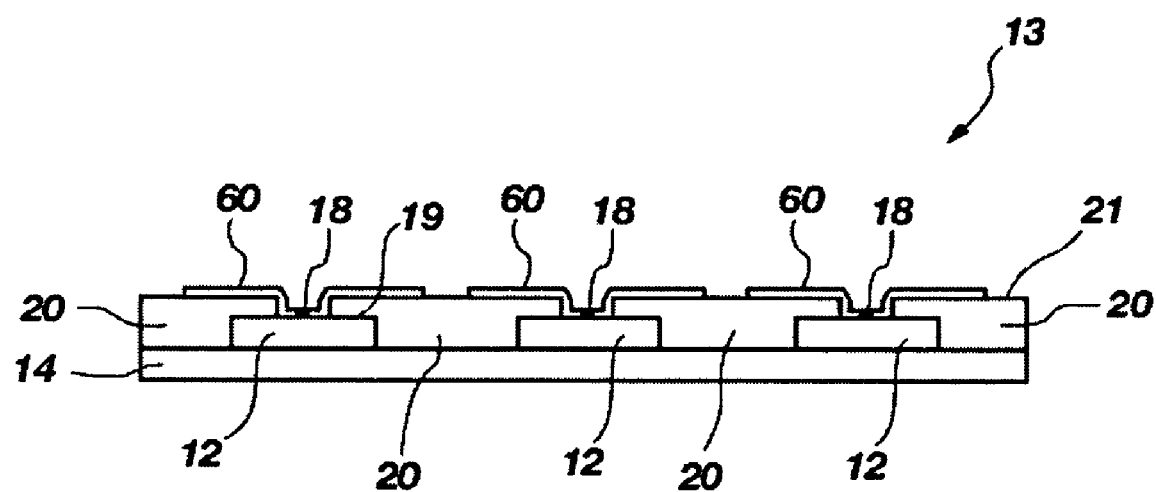
FIG. 1H is a side cross-sectional view of the assembly shown in FIG. 1G, including conductive traces formed thereon.

Thus, the contact or bond pads 18 of semiconductor dice 12 may be exposed, through apertures 23 to enable formation of associated conductive traces and bond pads. More particularly, FIG. 1H shows the packaged assembly 13 of FIG. 1G, but also including conductive traces 60, wherein conductive traces 60 may be formed by CVD processes, cold-metal deposition processes, plating processes, or other conventional additive techniques in combination with photoresist application, masking, and etching processes for forming metal conductive circuit elements. Also, it should be noted that the conductive traces 60 might be formed by way of conductive paste deposited through a stencil mask, as described above. Alternatively, conductive traces 60 may be formed by way of selective removal of copper (as by masking and etching) from a copper/dielectric laminate or by other conventional subtractive techniques. Conductive traces may be formed onto the active surfaces 19 of semiconductor dice 12, over a portion of the vertical sidewall of packaging material 20, and extending onto the upper surface 21 thereof.

Of course, wire bonds (not shown) may extend from the contact or bond pads 18 of semiconductor dice 12 to conductive traces (not shown) formed on the upper surface 21 of package material 20. Such a configuration may be analogous to a lead-over-chip (LOC) type configuration.

In another embodiment, conductive photopolymer materials may be used to form conductive traces 60 extending from contact or bond pads 18 of semiconductor dice 12. Particularly, conductive traces 60 may be formed stereolithographically. In one embodiment, a known photopolymer may be mixed with a conductive particle or a conductive precursor. For instance, conductive traces 60 may initially comprise an uncured state, such as a liquid photopolymer having electrically conductive (e.g., a metal or a metal precursor) therein, where exposure to ultraviolet light or other subsequent processing may produce an at least partially cured conductive film. In a particular example, known photopolymers may be mixed with silver particles and at least partially cured to form conductive traces 60. Commercially available photopolymers for use in stereolithography systems are available from Ciba Specialty Chemicals Inc.

Such conductive traces 60 may be particularly suited to be used in combination with package material 20, since both may be hardened by exposure to UV light or heat. For instance, the upper surface of package material 20 may be cured, substantially as a whole, meaning across substantially the entire upper surface. Then, conductive traces 60 may be formed of conductive photopolymer materials and then the remaining uncured package material 20, as well as the uncured conductive traces 60, may be cured substantially as a whole. As a further alternative, conductive traces 60 may be formed according to a precision spray deposition process as disclosed in U.S. Pat. No. 6,251,488, as mentioned above.

In yet another embodiment, conductive traces 60 may first be formed upon at least a portion of the active surface 19 of semiconductor dice 12, which has a substantially robust dielectric layer thereon, such as a spin-coated polymer. Then, packaging material 20, such as a photopolymer, may be deposited in and around the conductive traces 60 and may be subsequently at least partially cured. The package material 20 may be selectively cured, substantially as a whole, to leave portions of conductive traces 60 exposed. Alternatively, package material 20, which is cured and encapsulates conductive traces 60, may be etched to expose a portion of conductive traces 60 therethrough. In other words, the package material 20 may first be deposited and at least partially cured to form an arrangement that is suited for forming conductive traces 60. Then, after conductive traces 60 are formed, the process for depositing and at least partially curing packaging material 20 may continue, including subsequent suitable processes for exposing at least a portion of conductive traces 60 to form connection recesses 36. Such a configuration and process may form a substantially homogeneous package material 20, with interstitial conductive traces 60 disposed therein and having connection recesses 36. As yet a further alternative, conductive elements may be formed according to any of the methods of the present invention, which are disclosed hereinbelow.

Consequently, a packaged assembly 13 including conductive traces 60 fabricated according to the processes described in relation to any of the above-mentioned processes may also be singulated between semiconductor dice 12 through package material 20 disposed therebetween to form a packaged die 80, as shown in FIG. 1I. Further, a dielectric layer 58, comprising additional package material 20 or other dielectric material, may be deposited over the conductive traces 60 by processes known in the art. Such a configuration may seal against moisture or contaminants from contacting the electrical connections between conductive traces and contact or bond pads 18 of semiconductor dice 12. Solder balls 37, as shown in broken lines, may be formed onto connection recesses 36, as desired, for connection with other devices or components.

Additionally, it may be desirable for discrete electrical components to be included within or as a part of semiconductor dice 12 during encapsulation thereof. For instance, it may be advantageous to form the package material 20 to a suitable size and configuration to allow for such electrical components to be mounted to semiconductor dice 12 or package material 20 as so-called "surface mount" components. One or more surface mount components may be installed after curing at least a portion of package material 20 about semiconductor dice 12 and, optionally, conductive traces may be formed before or after installation of surface mount components. Additional package material 20 may be disposed about the one or more surface mount components and become cured thereafter.

It is further contemplated that placement of surface mount components may be performed via "pick and place" machinery, as known in the art. Such pick and place machinery may be configured to install or position surface mount components suitably for operation with semiconductor dice 12. It may be desirable to rinse the semiconductor dice 12 to remove any uncured package material therefrom, install any surface mount components, and return the semiconductor die 12 to the package material deposition equipment for continued application and at least partial curing of package material 20.

Of course, package material 20 may include features configured for forming conductive vias, conductive traces, bond pads, or combinations thereof. Therefore, after disposal of uncured package material 20 about semiconductor dice 12, UV light may be passed through an exposure mask, as known in photolithography, wherein the exposure mask is configured to selectively block or allow passage of the light therethrough. The exposure mask may be configured so as to prevent UV light from interacting with uncured package 20 material proximate to the contact or bond pads 18 of the semiconductor dice 12, and thus, not cure the same. Such a configuration may allow for increased flexibility in design of semiconductor dice 12.

Thus, geometrical features may be formed by curing, en masse, a volume of uncured package material 20, as through an exposure mask, and then changing the position of the free surface (upper surface) of the uncured package material, hardening a different area of uncured package material 20, or a combination of both. Such a configuration may provide for formation of repetitive topographical features in minimal time. However, if penetration of UV light is only effective for curing the package material to a limited depth from the surface initially encountered by the UV light, subsequent heating or microwave curing may be performed to effectively cure remaining uncured package material under a partially cured "skin" of photopolymer. Further, it would be apparent that the uncured package material proximate the contact or bond pads of the semiconductor dice may preferably be removed, as by rinsing with a solvent or otherwise, prior to curing by heating.

Additionally, generally, it may be advantageous to form or place structures for preventing uncured package material from covering contact or bond pads of semiconductor dice.

Accordingly, in one embodiment, cover elements may be disposed adjacent to contact or bond pads and affixed to the active surfaces of semiconductor dice 12 prior to disposing uncured package material 20 about the periphery of semiconductor dice 12. Explaining further, cover elements may be affixed to the active surfaces 19 of semiconductor dice 12 so as to seal against entry of the uncured package material 20. In another embodiment, barrier structures may be formed or applied so as to extend vertically from the active surfaces 19 of a semiconductor dice 12 about a periphery beyond the contact or bond pads 18. The barrier structures may be formed so as to prevent uncured package material 20 from covering the contact or bond pads 18 of the semiconductor dice 12 so long as the uncured package material 20 height does not exceed the height of the barrier structures.

Figure 2A:
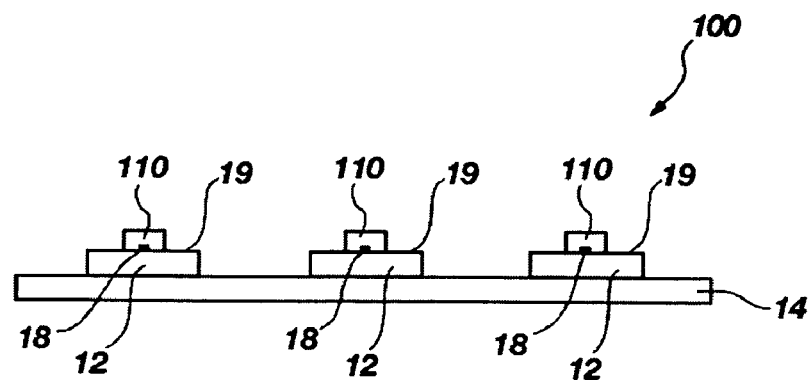
FIG. 2A is a side cross-sectional view of an array of semiconductor dice including cover elements positioned over the contact pads thereof.

In further detail, FIG. 2A shows cover elements 110 disposed upon semiconductor dice 12 of array 100 of the present invention, wherein cover elements 110 engage against the active surfaces 19 of semiconductor dice 12 so as to prevent package material 20 from covering contact or bond pads 18. Cover elements 110 may be preformed and pressed against active surfaces 19, so as to seal thereagainst, or may be adhesively affixed thereto, so as to seal thereto. Further, cover elements 110 may be hardened substantially as a whole, formed onto the active surfaces 19 of semiconductor dice 12, by way of selective exposure of package material 20 through an exposure mask. Alternatively, cover elements 110 may be formed onto the active surfaces 19 of semiconductor dice 12, as by, for instance, stereolithography. Cover elements 110 may comprise polyimide, a cured photopolymer, a rubber, or an elastomer. Such materials may provide the ability to seal against the active surfaces 19 of semiconductor dice 12.

Figure 2B:
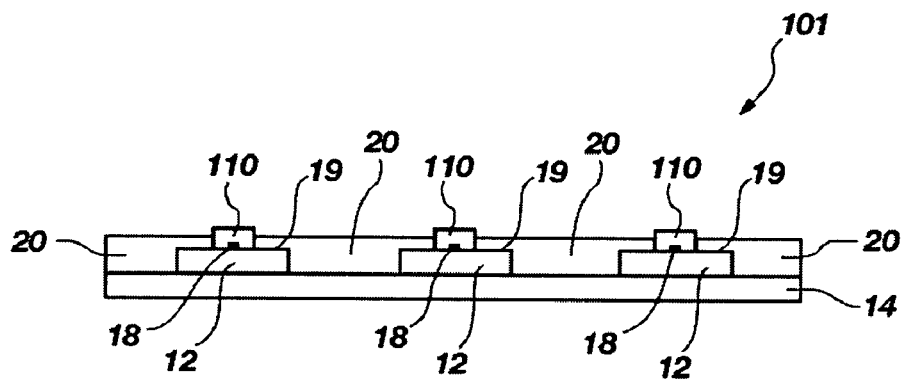
FIG. 2B is a side cross-sectional view of the array shown in FIG. 2A, including encapsulating material disposed about the semiconductor dice to form an assembly.
Figure 2C:
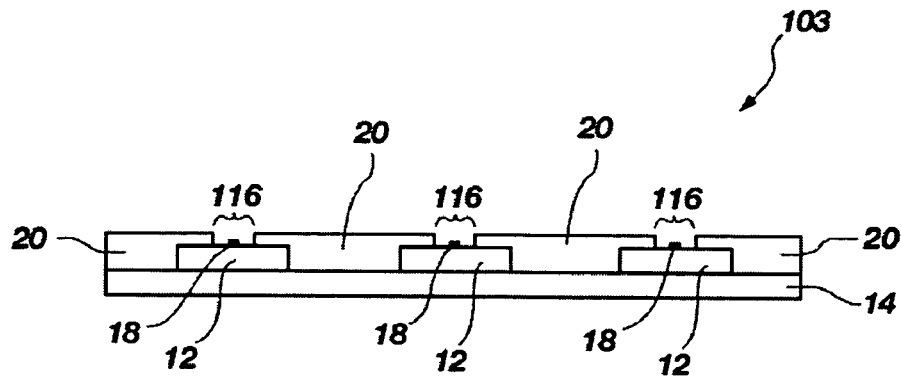
FIG. 2C is a side cross-sectional view of the assembly shown in FIG. 2B, but without cover elements.

Uncured package material 20 may be disposed about semiconductor dice 12, as shown in FIG. 2B, showing array 101. Uncured package material 20 may extend vertically along the sidewall of cover elements 110, or may be substantially coplanar with the active surface 19 of semiconductor dice 12, without limitation. Further, package material 20 may be cured substantially in response to exposure to a UV light or heat, e.g., curing of package material 20 by broad-source UV light in a chamber, thermal cure in an oven, microwave cure, or a combination thereof, as described above. If UV light is used, the cover elements 110 may prevent curing of any package material 20 that, although unintended, becomes disposed between the cover element 110 and the contact or bond pads 18 by way of physically blocking the UV light. Thus, after curing of package material 20, cover elements 110 may be removed from engagement with active surfaces 19 of semiconductor dice 12 to form assembly 103, as shown in FIG. 2C, so that the volumes or spaces previously occupied by cover elements 110 form apertures 116, which may be configured to allow formation of conductive traces (not shown) as described above in relation to FIGS. 1D and 1H.

Figure 3A:
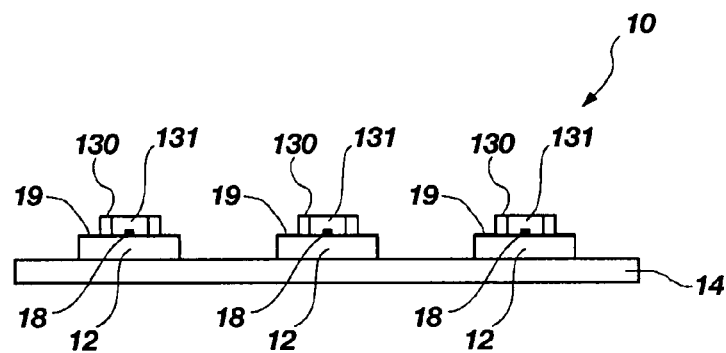
FIG. 3A is a side cross-sectional view of an array of semiconductor dice including barrier structures disposed on the active surfaces thereof.

As to barrier structures, FIG. 3A shows barrier structures 130 disposed upon semiconductor dice 12 of array 10 of the present invention, wherein barrier structures 130 engage against the active surfaces 19 of semiconductor dice 12 so as to prevent package material 20 from covering contact or bond pads 18. Barrier structures 130 may form a continuous wall that forms an aperture 131 along its interior and may comprise polyimide, a cured photopolymer, a rubber, or an elastomer. Also, barrier structures 130 may be preformed and pressed against active surfaces 19, so as to seal thereagainst, or may be adhesively affixed thereto, so as to seal thereagainst. Alternatively, barrier structures 130 may be formed onto the active surfaces 19 of semiconductor dice 12, cured substantially as a whole or as by stereolithography techniques.

Figure 3B:
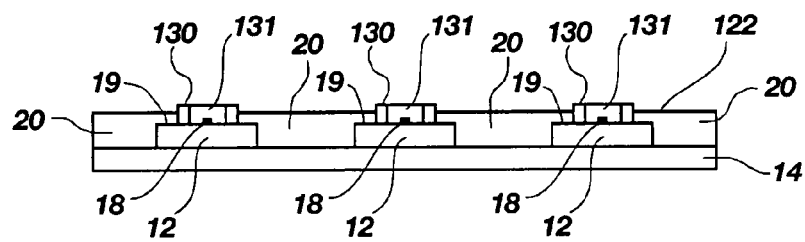
FIG. 3B is a side cross-sectional view of the array shown in FIG. 3A, including encapsulating material disposed about the semiconductor dice to form an assembly.

After positioning of barrier structures 130 upon the active surfaces 19 of semiconductor dice 12, package material 20 may be disposed about semiconductor dice 12, as shown in FIG. 3B. Uncured package material 20 may extend vertically along the sidewall of barrier structures 130, but may be prevented from contact with contact or bond pads 18, so long as the vertical level of package material 20 does not exceed the upper surface of barrier structures 130. Alternatively, uncured package material 20 may be disposed substantially coplanar with or even vertically lower than the active surface 19 of semiconductor dice 12 so that the barrier structures 130 are merely to make certain that uncured package material 20 does not cover contact or bond pads 18 of semiconductor dice 12, without limitation. Package material 20 may be at least partially cured in response to exposure to a UV light, heat, microwave, e.g., at least partially curing package material 20 by broad-source UV light in a chamber, thermal cure in an oven, microwave cure, or combinations thereof, as described above. Thus, after curing of package material 20, barrier structures 130 may be removed from active surfaces 19 of semiconductor dice 12, or, alternatively, may remain on the active surfaces 19 of semiconductor dice 12 and may be reduced in height to be substantially coplanar with the upper surface 122 of package material 20, by way of, for instance, planarizing the barrier structures 130.

Figure 3C:
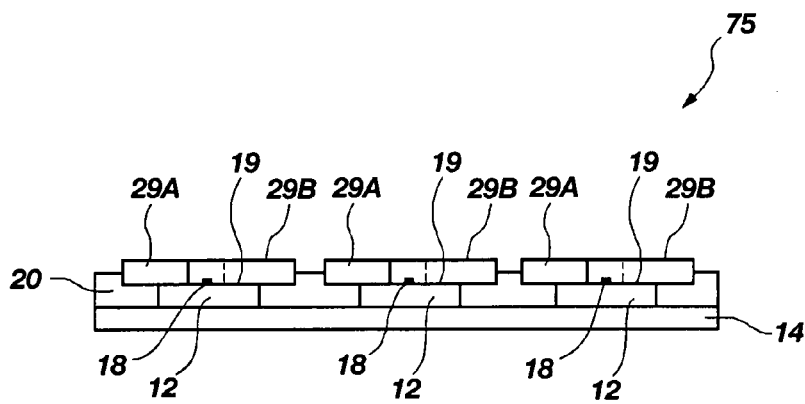
FIG. 3C is a partial side cross-sectional view of an array of semiconductor dice including encapsulating material disposed about the semiconductor dice to form an assembly.
Figure 3D:
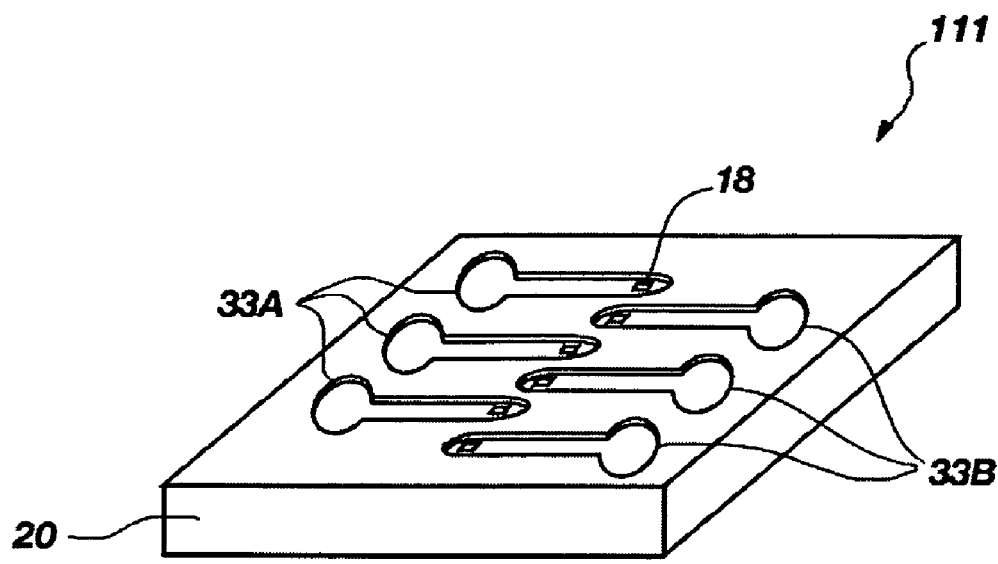
FIG. 3D is a perspective view of a packaged die of the present invention.

In yet a further embodiment contemplated by the present invention, encapsulation of a semiconductor die according to the present invention may form recesses for conductive traces. Explaining further, referring to FIG. 3C, which shows a partial side cross-sectional view of an array 75 of semiconductor dice 12, cover elements 29A and 29B may be positioned in an alternating fashion, extending from a respective contact or bond pad 18 of each of the semiconductor dice 12 laterally outwardly therefrom (in different directions as shown in FIG. 3C) and engaging against the active surfaces 19 of semiconductor dice 12, 50 as to prevent package material 20 from covering contact bond pads 18. Cover elements 29A and 29B may comprise polyimide, a cured photopolymer, a rubber, an elastomer, or another material exhibiting the ability to seal against the active surfaces 19 of semiconductor dice 12. Of course, a force may be applied to the cover elements 29A and 29B generally toward the active surfaces 19 of each of semiconductor dice 12 to facilitate forming or maintaining a seal thereagainst. Further, uncured package material 20 may be disposed about semiconductor dice 12 and package material 20 may be cured en masse as described above. If UV light is used, the cover elements 29A and 29B may prevent curing of any package material 20 that may unintentionally become disposed between the cover elements 29A or 29B and the contact or bond pads 18 by physically blocking the UV light. Accordingly, referring to FIG. 3D, after curing of package material 20, cover elements 29A and 29B may be removed from engagement with active surfaces 19 of semiconductor dice 12 and semiconductor dice 12 may be singulated to form a packaged die 111, shown in a perspective view, wherein the spaces previously occupied by cover elements 29A and 29B, respectively, form recesses 33A and 33B, which may be structured for formation of conductive traces, bond pads, or both therein for providing electrical communication with bond or contact pads 18 of each of semiconductor dice 12.

Figure 3E:
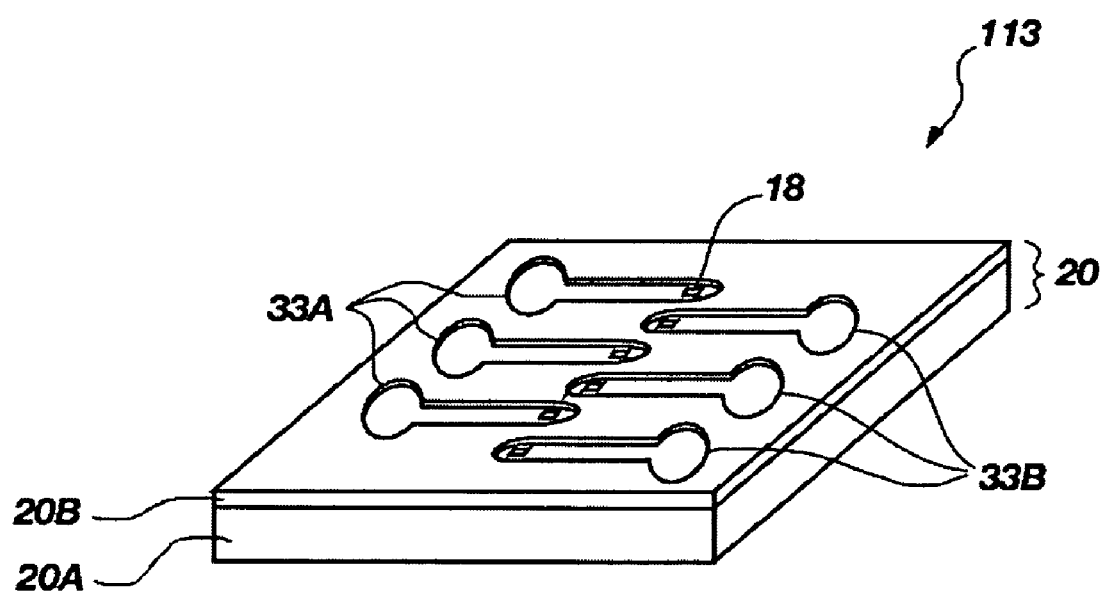
FIG. 3E is a perspective view of another packaged die of the present invention.

As a further alternative, referring to FIG. 3E, which shows a perspective view of a packaged die 113, package material 20 may be formed about each of a plurality of semiconductor dice 12 (FIG. 1) in two portions, 20A and 20B. For example, portion 20A of package material 20 may be formed by the process described above, with respect to FIGS. 1B and 1C for forming encapsulation substantially to the active surface 19 of semiconductor dice 12, or surrounding a portion of semiconductor dice 12 as otherwise desired. Portion 20A of package material 20 may be cured substantially en masse. Portion 20B of package material 20 may be formed stereolithographically (i.e., layer by layer), as described in U.S. Pat. No. 6,549,821 to Farnworth et al., as referenced hereinabove. Optionally, portion 20B may be formed as described with respect to FIGS. 3C and 3D, to provide relative flexibility in modifying or selecting the configuration of recesses 33A and 33B. Each of semiconductor dice 12 may be diced or singulated after forming portion 20A, after forming portion 20B, or after forming both portion 20A and portion 20B, to form a packaged die 113 as shown in FIG. 3E. Of course, if a plurality of semiconductor dice 12 is partially encapsulated (i.e., by forming either portion 20A or 20B) and then singulated, each of the plurality of singulated semiconductor dice may be positioned within a tray or upon another substrate for forming the other portion (20A or 20B) as desired.

Summarizing, generally, the present invention contemplates performing or causing substantially en masse curing of uncured package material about one or more semiconductor dice. Curing the package material substantially as a whole may occur so as to leave the contact or bond pads of the one or more semiconductor dice exposed, or may occur so that subsequent removal of a portion of cured package material may be required to expose the contact or bond pads of the semiconductor dice. In addition, the packaging method of the present invention may be applied, by way of example and not limitation, to an unpackaged die, a die mounted to a lead frame (having a die mounting paddle or in a paddle-less leads-over-chip (LOC) or in a leads-under-chip (LUC) configuration), mounted to a carrier substrate in a chip-on-board (COB) or board-on-chip (BOC) arrangement, or in other packaging designs, as desired.

Turning to another aspect of the present invention, conductive elements may be formed upon a substrate or chip-scale package (CSP) by forming an organometallic layer over substantially an entire surface, as by application of a liquid and drying, if necessary, and then selectively processing the applied organometallic layer to form conductive traces. More particularly, in one embodiment, selectively exposing at least a portion of the organometallic layer to a heat source, such as a laser beam, may concentrate or form the metallic constituents therein sufficiently to form a conductive element. Alternatively, selective exposure of the organometallic layer to a laser beam may form a seed layer for forming a metal trace thereon by electrolytic processes, electroless processes, or other plating processes.

More specifically, as shown in FIGS. 4A–4F, conductive traces 218, conductive via 214, and terminal pads 216 may be formed by first applying an organometallic layer 220 to substantially the upper surface 217 of substrate 222 followed by selective patterning thereof. Organometallic layer 220 may initially comprise a powder or a liquid, such as a polymer having metal, metallic compounds, or metal precursors therein, which may be subsequently dried and exposed to heat, a controlled atmosphere, or both heat and a controlled atmosphere may produce a metallic film or metallic seed layer. For instance, Emulsitone palladium (palladiumfilm) or Emulsitone platinum (platinumfilm), among others, commercially available from Emulsitone Company of Whippany, N.J., may be used to form an organometallic layer 220. Explaining further, an organometallic layer 220 may be applied to at least a portion of the surface of substrate 222 by spin-coating, spraying, immersing, dipping, printing, or as otherwise known in the art. Portions of the organometallic layer 220 may be selectively exposed to a laser beam, under a controlled atmosphere, such as forming gas (e.g., a mixture of about 90–95% nitrogen and 5–10% hydrogen), if necessary, to cause the organometallic layer 220 to chemically convert, concentrate, or otherwise remove organic constituents therefrom and to form a metallic film or seed layer. Explaining further, because platinum or palladium may oxidize at elevated temperatures, use of a forming gas or other oxidation inhibiting atmosphere may facilitate formation of a suitable metallic film or metallic seed layer. Of course, beam power, pulse rate, melting temperature of the organometallic layer 220, as well as other process influencing parameters may be desirable or necessary for causing the organometallic layer 220 to form a metallic film or metallic seed layer.

Alternatively, organometallic layer 220 may comprise a particulate that is disposed over substantially the surface onto which conductive traces 218, terminal pads 216, or both are desired to be formed. Such a configuration may eliminate the need for a solvent to be used to remove an initial liquid or semiliquid layer that is dried upon a surface. If the exposed organometallic layer 220 forms a seed layer, electrolytic processes, electroless processes, or other plating processes may be used to deposit metal thereon to form conductive traces 218 and terminal pads 216.

Assuming that a liquid or slurry is dried to form an organometallic layer 220, in order to pattern the organometallic layer 220, portions thereof may be selectively exposed to a laser beam to form a metallic film. The remaining unexposed or partially exposed organometallic layer 220 may be dissolved or washed away by a solvent, such as isopropyl alcohol. Such a configuration and process may eliminate the need for conventional patterning processes, such as resist and etching processes, to pattern organometallic layer 220. Thus, the exposed metallic film may be used directly as conductive traces 218 or terminal pads 216. Alternatively, the exposed metallic film may be used as a seed layer for forming subsequent electroless or electroplated metal layers thereon to form conductive traces 218 or terminal pads 216.

Figure 4A:
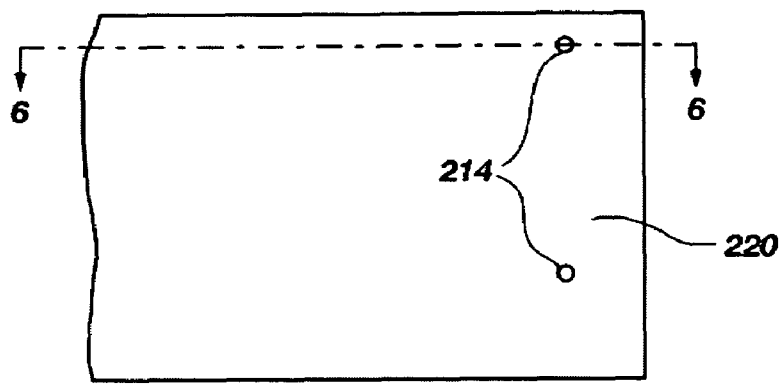
FIG. 4A is a top elevation of a substrate of the present invention including an organometallic layer.
Figure 4B:
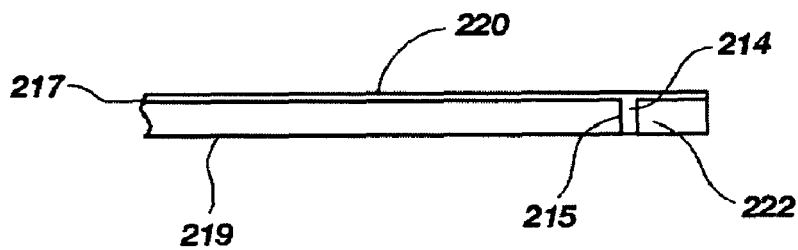
FIG. 4B is a partial side cross-sectional view of the substrate shown in FIG. 4A.
Figure 4C:
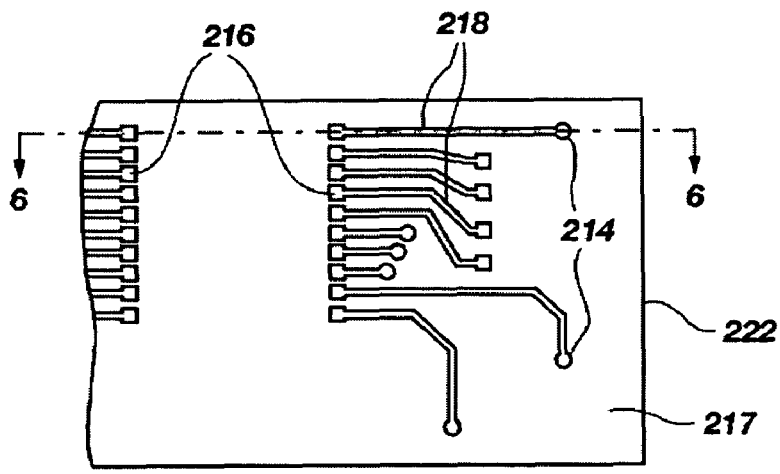
FIG. 4C is a top elevation of the substrate shown in FIGS. 4A and 4B, wherein the organometallic layer has been patterned.
Figure 4D:
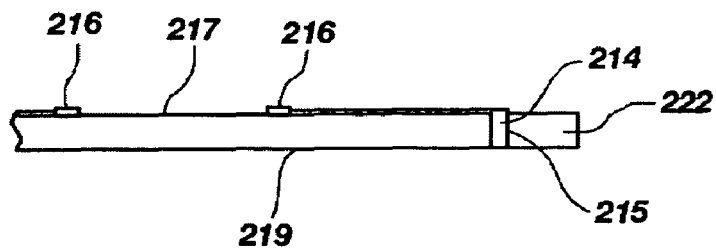
FIG. 4D is a partial side cross-sectional view of the substrate shown in FIG. 4C.
Figure 4E:
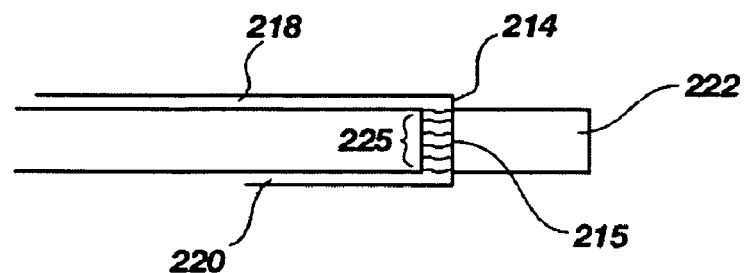
FIG. 4E is an enlarged partial side cross-sectional view of a conductive via of the present invention extending through a substrate.
Figure 4F:
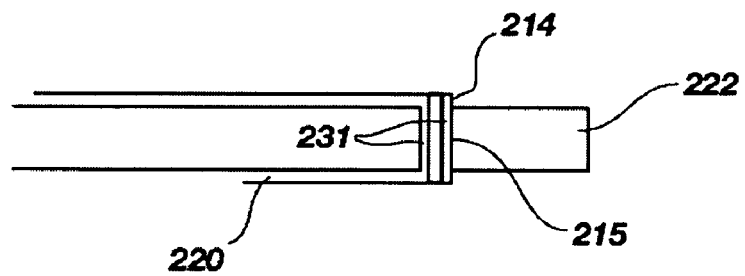
FIG. 4F is an enlarged partial side cross-sectional view of a conductive via of the present invention extending through a substrate.

Moreover, in the case of conductive via 214, as shown in FIG. 4E, via holes 215 may be filled by repeated formation of sequentially stacked organometallic layers 225 therein, if necessary, with associated repeated exposure to a laser beam or other heat source, under a controlled atmosphere or independent thereof. Alternatively, the conductive via 214 may comprise an organometallic material that may be selectively heated to form a conductive film 231 therein having a bore therethrough, as shown in FIG. 4F. Selective heating may be generated by a laser beam impinging upon organometallic material proximate via hole 215. Thus, conductive via 214 may comprise a conductive film formed on the boundary or side wall of the via holes 215 by way of selectively heating the organometallic material within via hole 215. Optionally, at least one subsequently formed electroless or electroplated metal layer may be formed upon a conductive film 231. The conductive via 214 may extend entirely through substrate 222 or may be a so-called "blind hole" (i.e., only partially through substrate 222), as known in the art. Alternatively, conductive via 214 may be formed conventionally.

FIGS. 4E and 4F also show that an additional organometallic layer 220 may be applied to the opposing surface of the substrate 222. Such a configuration may be suited for forming different terminal pad 216 configurations (i.e., redistributing the electrical contacts) on the opposing sides of a substrate 222. Thus, additional conductive traces (not shown) may be formed on the backside 219 (FIGS. 4B and 4D) of substrate 222 as well, by selective heating and removal of at least a portion of the organometallic layer 220, as described hereinabove.

The use of at least one organometallic layer 220 is not limited to disposition upon rigid substrates, such as ceramic or FR4 materials. Rather, substrate 222 may comprise a rigid or flexible substrate. For instance, substrate 222 may comprise a polyimide dielectric layer. Of course, the thickness of a substrate 222 comprising a polyimide dielectric layer may determine its flexibility. Accordingly, the present invention contemplates that the method for forming a conductive element of the present invention may encompass substrates that are relatively rigid, such as printed circuit board substrates, as well as relatively flexible substrates, such as those used in TAB, or substrates that are intermediate in flexibility, without limitation.

In a further aspect of the present invention, referring to FIGS. 5A–5E, conductive elements may be formed upon a substrate 322 by applying a conductive photopolymer or metal powder in a metallic layer 320 to substantially the upper surface 317 of a substrate 322 and then selectively processing the applied metallic layer 320 to form conductive traces 318, terminal pads 316, or combinations thereof. Specifically, metallic layer 320 may be selectively patterned by performing a resist and etch process in relation thereto to form conductive traces 318, terminal pads 316, or combinations thereof.

More specifically, as shown in FIGS. 5A–5E, conductive traces 318, conductive vias 314, and terminal pads 316 may be formed by first applying an uncured metallic layer 320 to substantially the upper surface 317 of substrate 322 followed by selective patterning thereof. Substrate 322 may comprise a rigid or flexible substrate. For instance, substrate 322 may comprise a polyimide, FR4, or ceramic material, without limitation.

Metallic layer 320 may initially comprise an uncured state, such as a liquid photopolymer having electrically conductive (e.g., metal or metal precursors) constituents therein, where exposure to ultraviolet light or other subsequent processing may produce an at least partially cured conductive film. Alternatively, metallic layer 320 may comprise an initially uncured metal powder or metallic paste that may be at least partially cured responsive to exposure to ultraviolet light or heat. For instance, U.S. Patent Application No. 20020176793 of Moussa et al. discloses a metallic paste for use in stereolithography equipment. In addition, other commercially available photopolymer resins may be obtained from 3D Systems, Inc. of Valencia, Calif. Metallic layer 320 may be applied to substantially the surface of substrate 322 by spin-coating, spraying, or as otherwise known in the art.

Figure 5A:
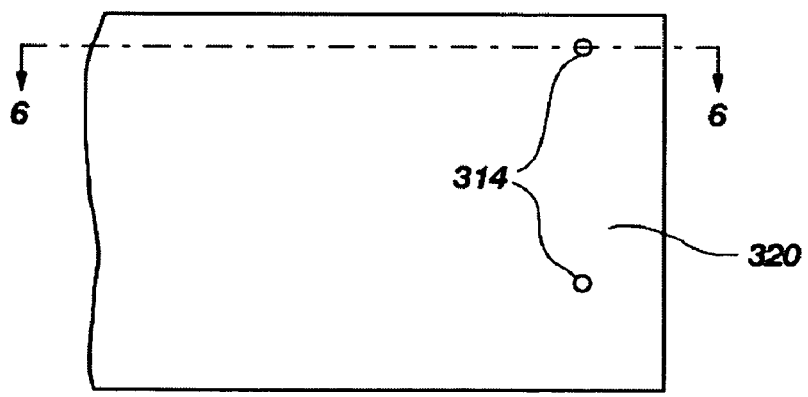
FIG. 5A is a top elevation of a substrate of the present invention including a metallic layer disposed substantially over the upper surface of a substrate.
Figure 5B:
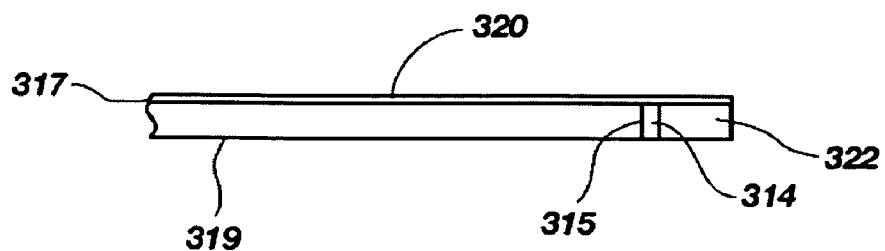
FIG. 5B is a partial side cross-sectional view of the substrate shown in FIG. 5A.
Figure 5C:
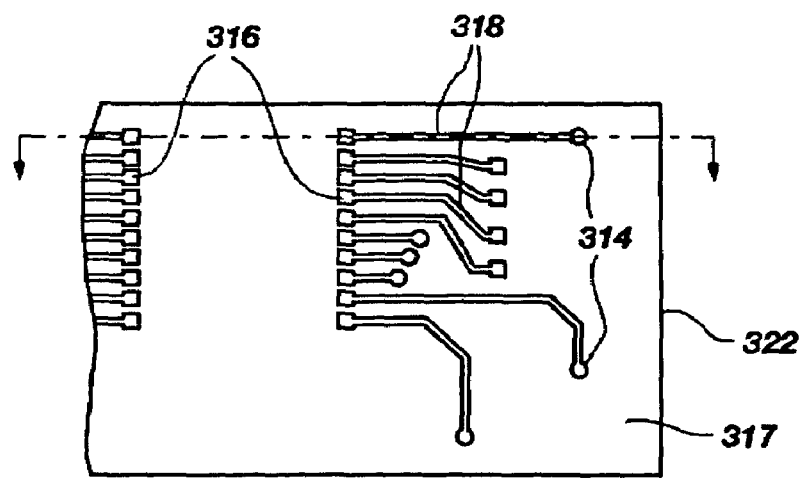
FIG. 5C is a top elevation of the substrate shown in FIGS. 5A and 5B, wherein the metallic layer has been patterned.
Figure 5D:
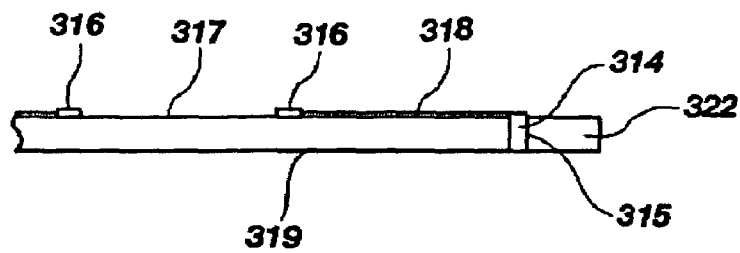
FIG. 5D is a partial side cross-sectional view of the substrate shown in FIG. 5C.

Further, to pattern the metallic layer 320, a resist layer (not shown) may be formed thereover and an etching process may be used to remove the portion of the cured metallic layer 320 that resist layer is not formed over. Then, resist layer may be removed (stripped), which leaves remaining patterned metallic layer 320 or, more specifically, conductive traces 318 and terminal pads 316. Thus, as shown in FIGS. 5C and 5D, conductive traces 318 and terminal pads 316 may be formed upon the upper surface 317 of substrate 322.

Figure 5E:
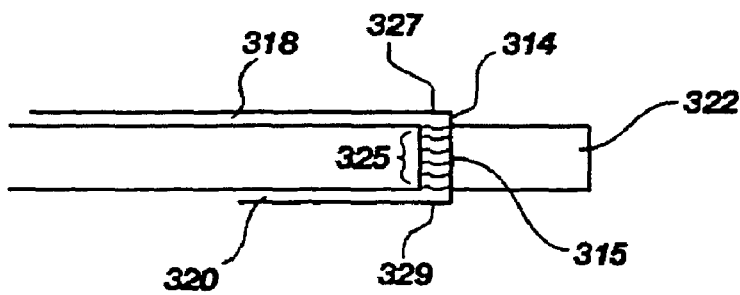
FIG. 5E is an enlarged partial side cross-sectional view of a conductive via of the present invention extending through a substrate.
Figure 6A:
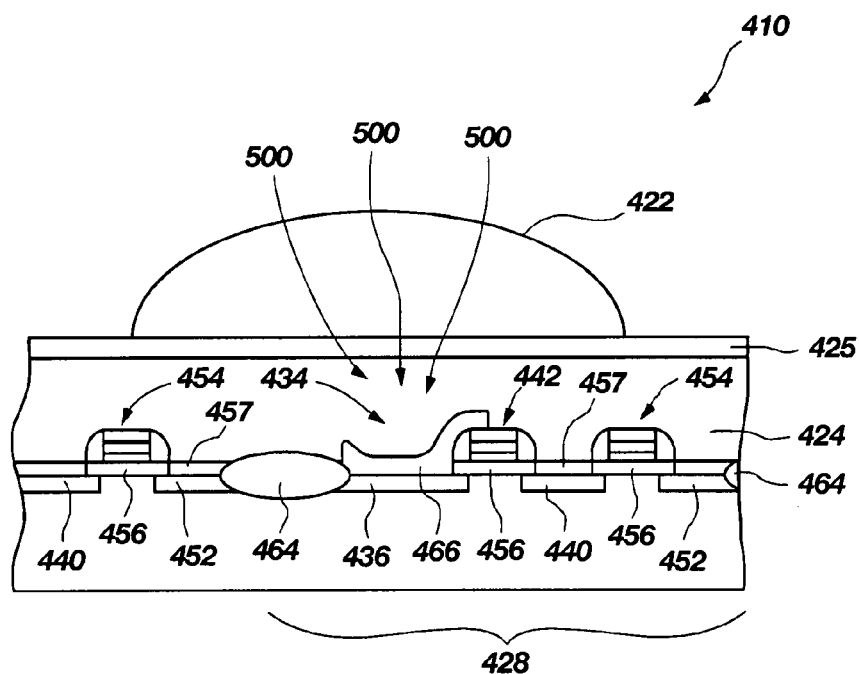
FIG. 6A is a partial side cross-sectional view of a microlens according to the present invention.
Figure 6B:
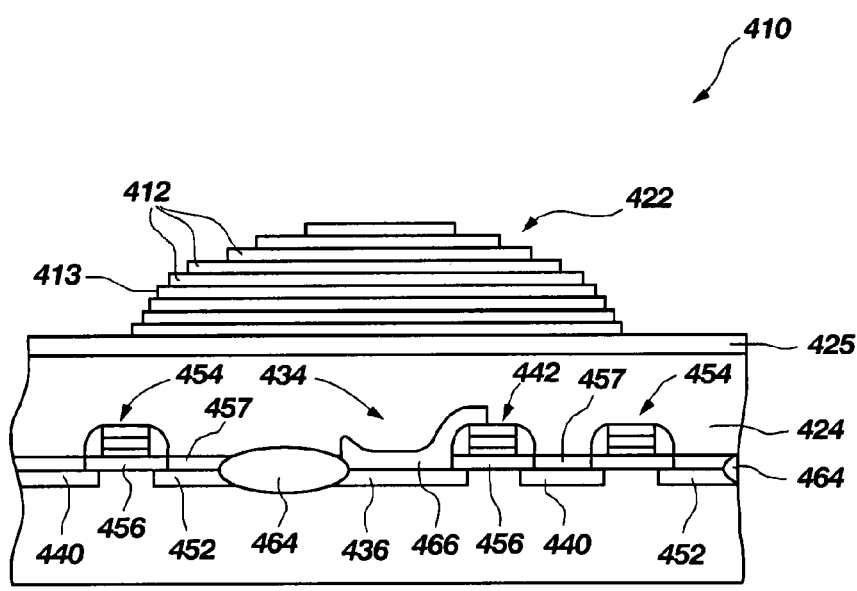
FIG. 6B is a partial side cross-sectional view of a microlens according to the present invention.

Furthermore, in the case of conductive vias 314, via holes 315, which may be formed by laser beam ablation, may be filled by repeated formation of sequentially stacked metallic layers 325 therein, as shown in FIG. 5E, if necessary, with associated repeated exposure to a UV light. Alternatively, the conductive vias 314 may be substantially filled with an electrically conductive photopolymer and at least partially cured. Selective heating may be generated by a UV light impinging upon the upper surface 327 of conductive vias 314, on the lower surface 329 of conductive vias 314, or both. Further, additional conductive traces (not shown) may be formed on the backside 319 of substrate 322 in addition to conductive traces 318 formed on the upper surface 317 of substrate 322 by forming an additional metallic layer 320 on the opposing side surface of substrate 322, as shown in FIG. 5E and patterning the additional metallic layer 320 as described hereinabove.

In yet a further aspect of the present invention, at least one microlens may be formed over or in proximity to a photosensor by stereolithography. Such a configuration may be useful in the fabrication of microlens arrays employed in CMOS imagers, as well as other devices. Stereolithography apparatus is known in the art and those of ordinary skill in the art will understand and appreciate that apparatus of other designs and manufacture, as well as modifications thereto, may be employed in practicing the method of the present invention. Stereolithographic apparatus and the operation thereof are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,076,974; 5,096,530; 5,104,592; 5,123,734; 5,130,064; 5,133,987; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,345,391; 5,358,673; 5,447,822; 5,481,470; 5,495,328; 5,554,336; 5,556,590; 5,569,431; 5,571,471; 5,573,722; 5,609,812; 5,609,813; 5,610,824; 5,630,981; 5,637,169; 5,651,934; 5,667,820; 5,676,904; 5,688,464; 5,693,144; 5,711,911; 5,779,967; 5,814,265; 5,854,748; 5,855,718; 5,885,511; 5,897,825; 5,902,537; 5,902,538; 5,904,889; 5,943,235; and 5,945,058. The disclosure of each of the foregoing patents is hereby incorporated herein in its entirety by this reference.

In accordance with the present invention, stereolithography resins that exhibit suitable optical transparency (after formation) may be employed for forming a microlens according to the present invention. For instance, one particular stereolithography resin or photopolymer that may be used in accordance with the present invention includes Somos® 10120 WaterClear™ from DSM Desotech of the Netherlands.

Additional apparatuses that may be useful in implementing the methods of the present invention, referred to as thermal stereolithography apparatuses, are described in great detail in United States Patents assigned to 3D Systems, Inc. of Valencia, Calif., such patents including, without limitation, U.S. Pat. Nos. 5,141,680; 5,344,298; 5,501,824; 5,569,349; 5,672,312; 5,695,707; 5,776,409; 5,855,836. The disclosure of each of the foregoing patents is hereby incorporated in its entirety herein by this reference. Exemplary commercially available thermal stereolithography apparatus operating generally in the manner as that described above may include, but are not limited to, the THERMOJET® printer offered by 3D Systems, Inc. of Valencia, Calif. Suitably optically transparent thermoplastic materials, or "thermopolymers," may be suitable for use in practicing the method of the present invention.

The present invention also encompasses formation of a microlens comprising a photopolymer or thermopolymer material that exhibits suitable optical transparency (after formation) in combination with stereolithography apparatuses or according to other methods and processes. For instance, a suitable optically transparent photopolymer or thermoplastic may be deposited for forming a microlens by way of so-called "maskless mesoscale materials deposition" (M3D). Such deposition may be selectively controlled, so that the optically transparent photopolymer or thermoplastic forms a desired shape or occupies a desired position.

Explaining further, during a maskless mesoscale materials deposition, a material may be aerosolized by using an ultrasonic transducer or a pneumatic nebulizer. Then, the aerosol stream may be focused using a flow guidance deposition head, which forms an annular, coaxial flow between the aerosol stream and a sheath gas stream. Further, patterning may be accomplished by moving the substrate or deposition head relative to one another. The optically transparent photopolymer or thermoplastic may be subsequently heated or selectively cured to consolidate the optically transparent photopolymer or thermoplastic, if necessary or desired. Commercially available maskless mesoscale materials deposition apparatus are produced by Optomec of Albuquerque, N. Mex.

In a further alternative, "micropen" deposition technology or similar type deposition technologies, as known in the art, may be used for forming a microlens according to the present invention. For instance, a suitable optically transparent photopolymer or thermoplastic may be deposited for forming a microlens by way of so-called micropen. Such deposition may be selectively controlled so that the optically transparent photopolymer or thermoplastic forms a desired shape, occupies a desired position, or both. The optically transparent photopolymer or thermoplastic may be subsequently heated or selectively cured to consolidate the optically transparent photopolymer or thermoplastic, if necessary or desired.

For instance, MicroPen™ technology is a direct writing method for patterning flowable materials with high precision through a controlled dispensing system. Commercially available MicroPen™ deposition apparatus are produced by OHMCRAFT, Inc. of Honeoye Falls, N. Y.

Alternatively, a suitable optically transparent photopolymer or thermoplastic may be deposited for forming a microlens by way of stamping technologies (which may also be known as microcontact printing technology), as known in the art, without limitation. In one example, a transfer die may be provided and may have a surface thereof including optically transparent photopolymer or thermoplastic. Further, the surface of the transfer die may directly contact a substrate so as to deposit at least a portion of the optically transparent photopolymer or thermoplastic onto the surface of the substrate. The optically transparent photopolymer or thermoplastic may be subsequently heated or selectively cured to consolidate the optically transparent photopolymer or thermoplastic, if necessary or desired.

As yet a further alternative for forming a microlens according to the present invention, a suitable optically transparent photopolymer or thermoplastic may be deposited by way of so-called 3-D printing technology, as known in the art, without limitation. One exemplary 3-D printing system, commercially available from Objet Geometries Ltd. of Rehovot, Israel, is the Eden 330®. In operation, the Eden 330® deposits photopolymer material via inkjet-type printer heads onto a support or other desired surface. For example, photopolymer as thin as 16 μm and at a 600×300 dpi (dot per inch) resolution may be deposited in a selected location using the printer heads currently available. After each deposition of a layer of photopolymer, an ultraviolet (UV) light may be used to cure and harden each layer. The deposition process is repeated by selectively depositing additional photopolymer, followed by subsequent curing until a desired, three-dimensional structure (e.g., a computer-generated solid model or computer-aided design) is formed. 3-D printing systems and methods are described in detail in U.S. Pat. Nos. 6,658,314; 6,644,763; 6,569,373; and 6,259,962 assigned to Objet Geometries Ltd., the disclosure of each of which is hereby incorporated, in its entirety, by reference herein. Further methods and apparatus related to 3-D printing technology are described in detail in U.S. Patent Applications 20020171177 A1 to Kritchman et al. and 20030151167 A1 to Kritchman et al., the disclosure of each of which are incorporated, in their entirety, by reference herein.

FIG. 6A shows a schematic partial side cross-sectional view of a portion of an array 410 of pixel sensors 428, particularly depicting one pixel sensor 428 of the array 410. Generally, as seen in FIG. 6A, each pixel sensor 428 may include a photosensor 434, which may be a photodiode, photogate, or the like, as known in the art. For instance, photosensor 434 may comprise a photogate semitransparent conductor 466, which is patterned. Source region 436, drain region 440, doped region 452, gate stack 442 formed onto insulating layer 456, gate stack 454 formed onto insulating layer 456, and gate oxide layer 457, may be configured to form one or more transistors, which may be controllable by electrical signals, as known in the art, wherein the signals may be used to operate the pixel sensor 428. Thus, an applied control signal may be communicated to the photosensor 434 so that when incident radiation 500 in the form of photons strikes the photosensor 434, the photo-generated electrons accumulate in the source region 436 under the photosensor 434. Field oxide regions 464 may isolate the pixel sensor 428 shown in FIG. 6A from other pixel sensors 428 in the array 410. Protective layer 424 may be formed over the supporting electrical elements and circuits mentioned above as well as photosensor 434. Spacer layer 425 may be formed prior to formation of microlens 422 and its thickness may be selected such that the photosensor 434 element may be preferably disposed generally proximate a focal point of radiation 500 traveling through microlens 422.

According to the present invention, microlens 422 may be fabricated by stereolithography techniques and apparatus. In one embodiment, microlens 422 may be fabricated directly. Specifically, as shown in FIG. 6B, microlens 422 may be formed of a plurality of superimposed, mutually adhered layers 412 of material. As noted above suitable materials for stereolithography may include photopolymers and thermoplastics, without limitation. Although layers 412 of microlens 422 are shown in FIG. 6B as being separate, such representation is merely for facilitating understanding for the reader. It should be understood that layers 412 of microlens 422 may form a suitably optically transparent volume that may be used to refractively direct or focus radiation (not shown) toward photosensor 434. However, since the overall thickness of microlens 422 may be relatively small, for instance, about 1 or 2 μm, conventional stereolithography apparatus and methods may require modification, such as miniaturization of the laser beam focal spot size and layer material deposition techniques to perform suitable stereolithographic processes for forming microlens 422.

Further, it maybe noted that each of layers 412 includes a substantially vertical side wall 413, the existence of which, depending on the layer thickness in relation to the overall thickness of the structure being fabricated, causes the outer side surfaces of microlens 422 to be rough or stepped. This phenomenon is well-known in the art, the overall effect of mutually adjacent layers with differing positioned substantially vertical walls being termed "stair-stepping." As the ability to form thinner layers increases, stair-stepping may be mitigated. Extrapolating even further, if the ability to form thin layers is advanced so that microlens 422 may comprise hundreds or thousands of mutually superimposed layers, the domed or arcuate surface thereof may be sufficiently smooth after stereolithographic formation of same. On the other hand, microlens 422 may adequately focus or direct light toward the photosensor 434 despite the presence of stair-stepping, or at some magnitude of stair-stepping or layer thickness.

Alternatively, the present invention contemplates that post-processing may be performed to a stereolithographically formed microlens 422 to mitigate or remove stair-stepping. For instance, stereolithographically formed microlens 422 may be reflowed to cause the material thereof to form an arcuate upper surface. Alternatively, microlens 422 may be chemically or mechanically processed to smooth the outer surface thereof. Particularly, brief exposure to a solvent or etching environment may tend to round the sharp corners of layers 412. Alternatively, micromachining, as with a laser beam, may be used to round the corners of layers 412. Any of such processes or combinations thereof may be used to smooth stair-stepped features of microlens 422.

Figure 7:
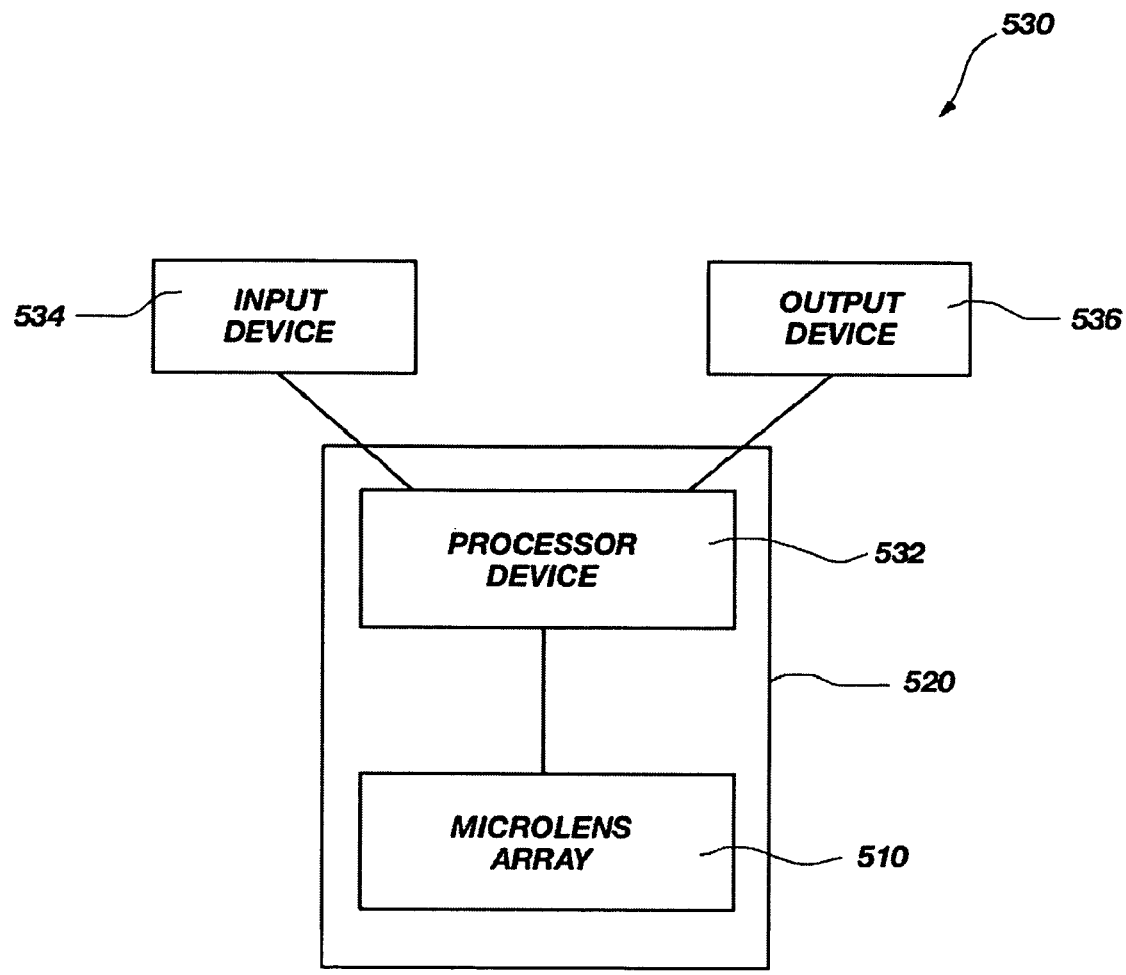
FIG. 7 shows a schematic block diagram of a system including a microlens array, including at least one microlens of the present invention.

It is further noted that the above-described embodiments of a microlens or a microlens array according to the present invention may be utilized in a computer or electronic environment. For example, FIG. 7 shows a schematic block diagram of system 530 according to the present invention. Microlens array 510 may be included in imaging device 520, such as a CMOS imager, the imaging device including a processor device 532, such as a central processing unit or other logic device, operably coupled thereto. Microlens array 510 may include at least one microlens according to the present invention as described above. Further, processor device 532 may also be coupled with one or more appropriate input devices 534 (e.g., mouse, push-button, touch screen, communication interface, hard drive, etc.) and one or more output devices 536 (e.g., a display, printer, communication interface, hard drive, etc.) within system 530. It is also noted that the microlens array 510 may be utilized in various computing environments, systems, and devices, such as, for example, cell phones, personal data assistants (PDAs), and other similar electronic devices.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of packaging a plurality of semiconductor dice, comprising:
   providing a plurality of semiconductor dice, each including an active surface and bond pads thereon, a backside generally opposite thereto, and an exterior periphery;
   affixing the backside of each of the plurality of semiconductor dice to a carrier;
   disposing flowable, uncured dielectric material at least partially around and between the plurality of semiconductor dice;
   at least partially curing, substantially as a whole, the flowable, uncured dielectric material; and
   singulating each of the plurality of the semiconductor dice through the cured dielectric material.

2. The method of claim 1, wherein disposing flowable, uncured dielectric material at least partially around and between the plurality of semiconductor dice comprises disposing uncured dielectric material over the active surface of each of the plurality of semiconductor dice.

3. The method of claim 2, wherein disposing flowable, uncured dielectric material at least partially around and between the plurality of semiconductor dice comprises at least one of immersing, dipping, spin-coating, printing, and spraying.

4. The method of claim 2, further comprising:
   curing the flowable, uncured dielectric material over the bond pads of each of the plurality of semiconductor dice; and
   removing a portion of the cured dielectric material to expose the bond pads of each of the plurality of semiconductor dice.

5. The method of claim 4, wherein removing the portion of the cured dielectric material to expose the bond pads of each of the plurality of semiconductor dice comprises:
   forming a resist over at least a portion of a surface of the cured dielectric material;
   etching the at least a portion of the surface of the cured dielectric material uncovered by the resist; and
   removing the resist from the at least a portion of the surface of the cured dielectric material.

6. The method of claim 1, further comprising:
   preventing the flowable, uncured dielectric material from contacting the bond pads of each of the plurality of semiconductor dice prior to at least partially curing, substantially as a whole, the flowable, uncured dielectric material.

7. The method of claim 6, wherein preventing the flowable, uncured dielectric material from contacting the bond pads comprises disposing a cover element in sealing engagement therewith.

8. The method of claim 6, wherein preventing the flowable, uncured dielectric material from contacting the bond pads comprises forming barrier structures extending from the active surface of each of the plurality of semiconductor dice and surrounding the bond pads thereof.

9. The method of claim 1, further comprising preventing the flowable, uncured dielectric material proximate to the bond pads of each of the plurality of semiconductor dice from curing.

10. The method of claim 1, further comprising forming conductive traces extending from the bond pads, respectively, of each of the plurality of semiconductor dice.

11. The method of claim 1, further comprising:
   disposing the flowable, uncured dielectric material at least partially around and between the plurality of semiconductor dice to a first vertical level;

at least partially curing, substantially as a whole, the flowable, uncured dielectric material at the first vertical level;

disposing the flowable, uncured dielectric material at least partially around and between the plurality of semiconductor dice to a second vertical level; and at least partially curing, substantially as a whole, the flowable, uncured dielectric material at the second vertical level.

12. The method of claim 1, further comprising installing a surface mount component in operable communication with each of the plurality of semiconductor dice, respectively.

13. The method of claim 1, wherein at least partially curing, substantially as a whole, the flowable, uncured dielectric material comprises exposing the flowable, uncured dielectric material to a light source.

14. The method of claim 13, wherein exposing the flowable, uncured dielectric material to a light source comprises exposing the flowable, uncured dielectric material to a light source through an exposure mask.

15. The method of claim 1, wherein at least partially curing, substantially as a whole, the flowable, uncured dielectric material comprises exposing the flowable, uncured dielectric material to a heat source.

16. The method of claim 1, wherein providing the plurality of semiconductor dice comprises providing a plurality of known good semiconductor dice.

* * * * *

UNITED STATES PATENT AND TRADEMARK OFFICE
CERTIFICATE OF CORRECTION

| | | |
|---|---|---|
| PATENT NO. | : 7,235,431 B2 | Page 1 of 1 |
| APPLICATION NO. | : 10/934109 | |
| DATED | : June 26, 2007 | |
| INVENTOR(S) | : Wood et al. | |

It is certified that error appears in the above-identified patent and that said Letters Patent is hereby corrected as shown below:

On the Title Page, Item (75) in "Inventors, lines 1-5, delete "Wood; Alan G. (Boise, ID), Farnworth; Warren M. (Nampa, ID), Watkins; Charles M. (Eagle, ID), Benson; Peter A. (Guilderland, NY)" and insert -- Wood; Alan G. (Boise, ID), Farnworth; Warren M. (Nampa, ID) --, therefor.

Signed and Sealed this

Twenty-fourth Day of March, 2009

JOHN DOLL
*Acting Director of the United States Patent and Trademark Office*